United States Patent
Sengoku

(10) Patent No.: US 9,842,020 B2
(45) Date of Patent: Dec. 12, 2017

(54) MULTI-WIRE SYMBOL TRANSITION CLOCKING SYMBOL ERROR CORRECTION

(71) Applicant: QUALCOMM Incorporated, San Diego, CA (US)

(72) Inventor: Shoichiro Sengoku, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 64 days.

(21) Appl. No.: 14/949,290

(22) Filed: Nov. 23, 2015

(65) Prior Publication Data

US 2016/0149729 A1    May 26, 2016

Related U.S. Application Data

(60) Provisional application No. 62/236,522, filed on Oct. 2, 2015, provisional application No. 62/216,692, filed
(Continued)

(51) Int. Cl.
*H04L 25/03* (2006.01)
*G06F 11/10* (2006.01)
(Continued)

(52) U.S. Cl.
CPC ........... *G06F 11/1004* (2013.01); *H03M 5/00* (2013.01); *H03M 13/03* (2013.01); *H03M 13/63* (2013.01);
(Continued)

(58) Field of Classification Search
USPC ....................................................... 375/340
See application file for complete search history.

(56) References Cited

U.S. PATENT DOCUMENTS 6,615,387 B1    9/2003   Williamson et al.
7,191,385 B2    3/2007   Olaker
(Continued)

FOREIGN PATENT DOCUMENTS

| CN | 101493804 A | 7/2009 |
| WO | WO-2015054548 | 4/2015 |
| WO | WO-2015195329 | 12/2015 |

OTHER PUBLICATIONS

International Search Report and Written Opinion—PCT/US2015/062511—ISA/EPO—Feb. 25, 2016.
(Continued)

*Primary Examiner* — Kevin M Burd
(74) *Attorney, Agent, or Firm* — Loza & Loza LLP

(57) ABSTRACT

Apparatus, systems and methods for error detection in transmissions on a multi-wire interface are disclosed. A method for correcting transmission errors in multi-wire transition-encoded interface may include determining whether a symbol error is present in the sequence of symbols based on a value of an error detection code (EDC) in the received plurality of bits, generating one or more permutations of the sequence of symbols, where each permutation includes one symbol that is different from corresponding symbols in the sequence of symbols and different from corresponding symbols in other permutations. A permutation in the one or more permutations may be identified as including a corrected sequence of symbols when it produces a decoded EDC value that matches an expected EDC value. The expected EDC value may correspond to a predefined value for EDCs transmitted over the multi-wire interface to enable detection of up to two symbol errors at the receiver.

30 Claims, 25 Drawing Sheets

Related U.S. Application Data on Sep. 10, 2015, provisional application No. 62/084,998, filed on Nov. 26, 2014.

(51) Int. Cl.

| | | |
|---|---|---|
| H04L 1/00 | (2006.01) | |
| H04L 27/38 | (2006.01) | |
| H03M 13/03 | (2006.01) | |
| H04L 1/24 | (2006.01) | |
| H04L 25/02 | (2006.01) | |
| H04L 25/14 | (2006.01) | |
| H04L 25/493 | (2006.01) | |
| H03M 5/00 | (2006.01) | |
| H03M 13/00 | (2006.01) | |

(52) U.S. Cl.
CPC .......... *H04L 1/0041* (2013.01); *H04L 1/0061* (2013.01); *H04L 1/245* (2013.01); *H04L 25/0264* (2013.01); *H04L 25/0272* (2013.01); *H04L 25/03286* (2013.01); *H04L 25/14* (2013.01); *H04L 25/493* (2013.01); *H04L 27/38* (2013.01)

(56) References Cited

U.S. PATENT DOCUMENTS

| | | | |
|---|---|---|---|
| 7,502,982 B2 | 3/2009 | Silvus et al. | |
| 7,526,710 B2 | 4/2009 | Sawaguchi | |
| 7,559,004 B1 | 7/2009 | Chang et al. | |
| 7,657,821 B1 | 2/2010 | Wakerly et al. | |
| 7,694,204 B2 | 4/2010 | Schmidt et al. | |
| 7,769,048 B2 | 8/2010 | Sharma | |
| 7,949,931 B2 | 5/2011 | Lastras-Montano | |
| 8,196,011 B2 | 6/2012 | Izumita et al. | |
| 8,401,120 B2 | 3/2013 | Ozgur | |
| 8,462,891 B2 | 6/2013 | Kizer et al. | |
| 8,522,122 B2 | 8/2013 | Alves et al. | |
| 8,824,581 B2 | 9/2014 | Okada | |
| 8,910,009 B1 | 12/2014 | Tang et al. | |
| 2003/0152154 A1 | 8/2003 | Johnson | |
| 2003/0237041 A1 | 12/2003 | Cole et al. | |
| 2009/0132894 A1 | 5/2009 | Xu et al. | |
| 2010/0050053 A1 | 2/2010 | Wilson et al. | |
| 2011/0209027 A1* | 8/2011 | Schmidt ............ | H04L 1/0045 714/752 |
| 2012/0179949 A1 | 7/2012 | Wang et al. | |
| 2014/0270026 A1* | 9/2014 | Sengoku ............ | H04L 7/027 375/355 |
| 2015/0100862 A1 | 4/2015 | Sengoku | |
| 2016/0147596 A1 | 5/2016 | Sengoku | |

OTHER PUBLICATIONS

Kanich C, "Lecture 3: Data Link I—Framing and Error Control", CSE 123 Computer Networks, Jul. 10, 2006, 10 Pages. Retrieved from Internet, URL http://cseweb.ucsd.edu/classes/su11/cse123-a/slides/123-su11-l3.pdf.

\* cited by examiner

FIG. 11

Table 1100 (r = 3):

| n | $r^n$ hex | $r^n$ bin |
|---|---|---|
| 0 | 00000001 | 00000000000000000000000000000001 |
| 1 | 00000003 | 00000000000000000000000000000011 |
| 2 | 00000009 | 00000000000000000000000000001001 |
| 3 | 0000001B | 00000000000000000000000000011011 |
| 4 | 00000051 | 00000000000000000000000001010001 |
| 5 | 000000F3 | 00000000000000000000000011110011 |
| 6 | 000002D9 | 00000000000000000000001011011001 |
| 7 | 0000088B | 00000000000000000000100010001011 |
| 8 | 00019A1 | 00000000000000000001100110100001 |
| 9 | 0004CE3 | 00000000000000000100110011100011 |
| 10 | 00E6A9 | 00000000000000001110011010101001 |
| 11 | 02B3FB | 00000000000000101011001111111011 |
| 12 | 081BF1 | 00000000000010000001101111110001 |
| 13 | 1853D3 | 00000000000110000101001111010011 |
| 14 | 48FB79 | 00000000010010001111101101111001 |
| 15 | DAF26B | 11011010111100100110101101101011 |

Table 1102 (r = 5):

| n | $r^n$ hex | $r^n$ bin |
|---|---|---|
| 0 | 00000001 | 00000000000000000000000000000001 |
| 1 | 00000005 | 00000000000000000000000000000101 |
| 2 | 00000019 | 00000000000000000000000000011001 |
| 3 | 0000007D | 00000000000000000000000001111101 |
| 4 | 00000271 | 00000000000000000000001001110001 |
| 5 | 00000C35 | 00000000000000000000110000110101 |
| 6 | 00003D09 | 00000000000000000011110100001001 |
| 7 | 0001312D | 00000000000000010011000100101101 |
| 8 | 0005F5E1 | 00000000000001011111010111100001 |
| 9 | 001DCD65 | 00000000000111011100110101100101 |
| 10 | 009502F9 | 00000000100101010000001011111001 |
| 11 | 02E90EDD | 00000010111010010000111011011101 |
| 12 | 00E8D4A51 | 00000000111010001101010010100001 |
| 13 | 048C27395 | 00000100100011000010011100110101 |
| 14 | 16BCC41E9 | 00010110101111001100010000011101 |
| 15 | 71AFD498D | 01110001101011111101010010001101 |

*FIG. 11*

| Dec | Hex | Bin | $\{e_k^i, e_k^{i+1}\}$ | $\{e_k^i, e_k^{i+1}\}$ list |
|---|---|---|---|---|
| -21 | EB | 11101011 | -4, 1 | |
| -18 | EE | 11101110 | -3, 3 | |
| -17 | EF | 11101111 | -3, 2 | |
| -16 | F0 | 11110000 | -4, -4 | -3, 1 |
| -13 | F3 | 11110011 | -2, 3 | -3, -2 |
| -12 | F4 | 11110100 | -3, -3 | -2, 2 |
| -9 | F7 | 11110111 | -1, 4 | -2, -1 |
| -8 | F8 | 11111000 | -2, -2 | -1, 3 |
| -7 | F9 | 11111001 | -2, -3 | |
| -4 | FC | 11111100 | -1, -1 | |
| -3 | FD | 11111101 | -1, -2 | |
| 3 | 03 | 00000011 | 1, 2 | |
| 4 | 04 | 00000100 | 1, 1 | |
| 7 | 07 | 00000111 | 2, 3 | |
| 8 | 08 | 00001000 | 2, 2 | 1, 3 |
| 9 | 09 | 00001001 | 1, 4 | 2, 1 |
| 13 | 0D | 00001101 | 2, -3 | 3, 2 |
| 16 | 10 | 00010000 | 4, 4 | 3, -1 |
| 17 | 11 | 00010001 | 3, -2 | |
| 18 | 12 | 00010010 | 3, 3 | |
| 21 | 15 | 00010101 | 4, -1 | |

$|e_k^i| \geq r$ $(e_k^i r - e_{k-1}^i)$ $r-1 \leq |e_{k-1}^i|$

Error coefficient $(e_k^i r - e_{k-1}^i)$ never becomes 0

1200

| Dec | Hex | Bin | $\{e_k^i, e_k^{i-1}\}$ list | |
|---|---|---|---|---|
| -21 | EB | 11101011 | -4, 1 | |
| -18 | EE | 11101110 | -3, 3 | |
| -17 | EF | 11101111 | -3, 2 | |
| -16 | F0 | 11110000 | -4, 4 | -3, 1 |
| -13 | F3 | 11110011 | -2, 3 | -3, 2 |
| -12 | F4 | 11110100 | -3, 3 | -2, 2 |
| -9 | F7 | 11110111 | -1, 4 | -2, 1 |
| -8 | F8 | 11111000 | -2, 2 | |
| -7 | F9 | 11111001 | -2, 3 | -1, 3 |
| -4 | FC | 11111100 | -1, 1 | |
| -3 | FD | 11111101 | -1, 2 | |
| 3 | 03 | 00000011 | 1, 2 | |
| 4 | 04 | 00000100 | 1, 1 | |
| 7 | 07 | 00000111 | 2, 3 | |
| 8 | 08 | 00001000 | 2, 2 | 1, -3 |
| 9 | 09 | 00001001 | 1, 4 | 2, 1 |
| 13 | 0D | 00001101 | 2, 3 | 3, 2 |
| 16 | 10 | 00010000 | 4, 4 | 3, 1 |
| 17 | 11 | 00010001 | 3, 2 | |
| 18 | 12 | 00010010 | 3, 3 | |
| 21 | 15 | 00010101 | 4, -1 | |

| | r | r-1 | Longest $2^n$ for $e_k$ or $e_{k-1}$ | Longest non-zero LSB of $(e_kr - e_{k-1})$ |
|---|---|---|---|---|
| 3 | $00011_2$ | $00010_2$ | 2 | $00010_2$ | $00010_2$ |
| 5 | $00101_2$ | $00100_2$ | 4 | $00100_2$ | $0010100_2$ |
| 7 | $00111_2$ | $00110_2$ | 4 | $00100_2$ | $0011000_2$ |
| 9 | $01001_2$ | $01000_2$ | 8 | $01000_2$ | $01000000_2$ |
| 11 | $01011_2$ | $01010_2$ | 8 | $01000_2$ | $0101000_2$ |
| 15 | $01111_2$ | $01110_2$ | 8 | $01000_2$ | $0111000_2$ |
| 23 | $10111_2$ | $10110_2$ | 16 | $10000_2$ | $10110000_2$ |

Replace LSB of r with 0
e.g.,
r=3=$00011_2$, → r-1=$00010_2$
r=5=$00101_2$, → r-1=$00100_2$
r=7=$00111_2$, → r-1=$0110_2$
r=15=$01111_2$, → r-1=$01110_2$
r=23=$10111_2$, → r-1=$10110_2$ $(2^n r - 2^n) = 2^n (r-1)$ Shift r-1 left by n-1 digits

| m | r |  |  |  |  |  |  |  |  |  | |
|---|---|---|---|---|---|---|---|---|---|---|---|
|  | 3 | 5 | 7 | 9 | 11 | 13 | 15 | 17 | 19 | 21 | 23 |
|  | 3 | 5 | 6 | 7 | 5 | 6 | 8 | 9 | 8 | 7 | 6 | Single symbol error
| 4 | 8 | 10 | 12 | 13 | 12 | 14 | 15 | 18 | 16 | 16 | 14 |
| 5 | 8 | 10 | 12 | 13 | 12 | 14 | 15 | 18 | 16 | 16 | 15 |
| 6 | 8 | 10 | 12 | 14 | 13 | 14 | 15 | 18 | 16 | 16 | 15 |
| 7 | 8 | 10 | 12 | 14 | 13 | 14 | 15 | 20 | 16 | 16 | 15 |
| 8 | 8 | 11 | 12 | 14 | 14 | 14 | 18 | 20 | 16 | 16 | 15 |
| 9 | 8 | 11 | 12 | 14 | 14 | 14 | 18 | 20 | 16 | 16 | 16 |
| 10 | 8 | 11 | 12 | 14 | 15 | 14 | 18 | 20 | 16 | 16 | 18 |
| 11 | 8 | 11 | 12 | 17 | 15 | 14 | 18 | 20 | 16 | 16 | 18 |
| 12 | 8 | 11 | 12 | 17 | 15 | 14 | 18 | 20 | 16 | 19 | 18 |
| 13 | 8 | 11 | 12 | 17 | 15 | 15 | 18 | 20 | 16 | 19 | 18 |
| 14 | 8 | 11 | 12 | 17 | 15 | 15 | 18 | 20 | 16 | 19 | 18 |
| 15 | 8 | 11 | 14 | 17 | 15 | 15 | 18 | 20 | 16 | 19 | 18 |
| 16 | 8 | 11 | 14 | 17 | 15 | 15 | 18 | 20 | 16 | 19 | 18 |
| 17 | 9 | 11 | 14 | 17 | 15 | 15 | 18 | 20 | 16 | 19 | 18 | Two symbol error detection
| 18 | 9 | 11 | 14 | 17 | 15 | 15 | 18 | 20 | 16 | 19 | 18 |
| 19 | 9 | 11 | 14 | 17 | 15 | 15 | 18 | 20 | 16 | 19 | 18 |
| 20 | 9 | 11 | 14 | 17 | 15 | 15 | 18 | 20 | 16 | 19 | 18 |
| 21 | 9 | 11 | 14 | 17 | 15 | 16 | 18 | 20 | 16 | 19 | 18 |
| 22 | 9 | 11 | 14 | 17 | 15 | 16 | 18 | 20 | 16 | 19 | 18 |
| 23 | 9 | 11 | 14 | 17 | 15 | 16 | 18 | 20 | 16 | 19 | 18 |
| 24 | 9 | 11 | 14 | 17 | 15 | 16 | 18 | 20 | 16 | 19 | 18 |
| 25 | 9 | 11 | 14 | 17 | 15 | 16 | 18 | 20 | 16 | 19 | 18 |
| 26 | 9 | 11 | 14 | 17 | 15 | 16 | 18 | 20 | 16 | 19 | 18 |
| 27 | 9 | 11 | 14 | 17 | 15 | 16 | 18 | 20 | 17 | 19 | 18 |
| 28 | 9 | 11 | 14 | 17 | 15 | 16 | 18 | 20 | 17 | 19 | 18 |
| 29 | 9 | 11 | 14 | 17 | 15 | 16 | 18 | 20 | 17 | 19 | 18 |
| 30 | 9 | 11 | 14 | 17 | 15 | 16 | 18 | 20 | 17 | 19 | 18 |
| 31 | 9 | 11 | 14 | 17 | 15 | 16 | 18 | 20 | 17 | 19 | 18 |
| 32 | 9 | 11 | 14 | 17 | 15 | 16 | 18 | 20 | 17 | 19 | 18 |

*FIG. 17*

MULTI-WIRE SYMBOL TRANSITION CLOCKING SYMBOL ERROR CORRECTION

CROSS-REFERENCE TO RELATED APPLICATIONS

This application claims priority to and the benefit of U.S. provisional patent application No. 62/236,522 filed Oct. 2, 2015, U.S. provisional patent application No. 62/216,692 filed Sep. 10, 2015, and U.S. provisional patent application No. 62/084,998 filed Nov. 26, 2014, the entire content of these applications being incorporated herein by reference.

BACKGROUND

Field

The present disclosure pertains to enabling efficient operations over data communication interfaces and, more particularly, facilitating error correction over data communication interfaces that employ symbol transition clocking transcoding.

Background

Data communication interfaces may employ symbol transition clocking transcoding to embed clock information in sequences of symbols that encode data to be transmitted over an interface that has multiple signal wires, thereby obviating the need for dedicated clock signal wires.

In certain examples of multi-signal data transfer, multi-wire differential signaling such as N-factorial (N!) low-voltage differential signaling (LVDS), transcoding (e.g., the digital-to-digital data conversion of one encoding type to another) may be performed to embed symbol clock information by causing symbol transition at every symbol cycle, instead of sending clock information in separate data lanes (differential transmission paths). Embedding clock information by such transcoding can also minimize skew between clock and data signals, as well as to eliminate the need for a phase-locked loop (PLL) to recover the clock information from the data signals. In one example, a two-wire serial bus operated in accordance with conventional Inter-Integrated Circuit (I2C) protocols or camera control interface (CCI) protocols can be adapted to provide a CCI extension (CCIe) bus, which uses symbol transition clocking transcoding. The CCIe bus supports support a higher bit rate than an I2C bus or a CCI bus.

Error detection and correction can be problematic in data transfer interfaces that employ transition encoding because there is typically no direct association between a signaling state error and errors in data decoded from the data transfer interface. The disassociation between data bits and signaling state can render conventional error detection techniques ineffective when applied to transition encoding interfaces.

It would be desirable to provide reliable error detection and correction in transmissions between devices that use symbol transition clocking transcoding to communicate.

SUMMARY

Various aspects of the disclosure relate to a method, a computer program, and an apparatus that improve functionality and operational efficiency of devices that can reliably detect errors that affect two or more symbols transmitted over a multi-wire transition-encoded interface, and that can correct a single symbol error for each sequence of symbols that encodes a single data word.

According to certain aspects, a method of correcting transmission errors at a receiver in a multi-wire interface includes receiving a sequence of symbols representative of the signaling state of a plurality of connectors, and decoding the sequence of symbols. The sequence of symbols may be decoded by converting the sequence of symbols into a transition number, and converting the transition number into a received plurality of bits. Each digit of the transition number may represent a transition between two consecutive symbols transmitted on the plurality of connectors. The method of correcting transmission errors may include determining whether a symbol error is present in the sequence of symbols based on a value of an error detection code (EDC) in the received plurality of bits. When the symbol error is determined to be present in the sequence of symbols, one or more permutations of the sequence of symbols may be generated, where each permutation includes one symbol that is different from corresponding symbols in the sequence of symbols and different from corresponding symbols in other permutations. The one or more permutations may be decoded and a permutation may be identified as a corrected sequence of symbols when it produces a decoded EDC value that matches an expected EDC value. The expected EDC value may correspond to a predefined value for EDCs transmitted over the multi-wire interface to enable detection of up to two symbol errors at the receiver.

According to certain aspects, an apparatus includes means for receiving a sequence of symbols representative of the signaling state of a plurality of connectors, and means for decoding the sequence of symbols. The means for decoding the sequence of symbols may be configured to convert the sequence of symbols into a transition number, each digit of the transition number representing a transition between two consecutive symbols transmitted on the plurality of connectors, and convert the transition number into a received plurality of bits. The apparatus may include means for determining whether a symbol error is present in the sequence of symbols based on a value of an EDC in the received plurality of bits, and means for correcting symbol errors operative when the symbol error is determined to be present in the sequence of symbols. The means for correcting symbol errors may be configured to generate one or more permutations of the sequence of symbols, each permutation including one symbol that is different from corresponding symbols in the sequence of symbols and different from corresponding symbols in other permutations, decode the one or more permutations, and identify a permutation as a corrected sequence of symbols when it produces a decoded EDC value that matches an expected EDC value. The expected EDC value may correspond to a predefined value for EDCs transmitted over the multi-wire interface to enable detection of up to two symbol errors at the receiver.

According to certain aspects, an apparatus includes a communications transceiver configured to provide a sequence of symbols representative of the signaling state of a plurality of connectors, a decoder circuit configured to convert a transition number representative of transitions between consecutive symbols in the sequence of symbols into a plurality of bits, an error detection circuit configured to determine whether symbol errors are present in the sequence of symbols based on a value of an EDC in the received plurality of bits, and an error correction circuit. The error correction circuit may be responsive to a determination that a symbol error is present in the sequence of symbols and may be configured to generate one or more permutations of the sequence of symbols, each permutation including one symbol that is different from corresponding symbols in the sequence of symbols and different from corresponding symbols in other permutations, decode the one or more permutations, and identify a permutation as a corrected sequence of symbols when it produces a decoded EDC value that matches an expected EDC value. The expected EDC value may correspond to a predefined value for EDCs transmitted over the multi-wire interface to enable detection of up to two symbol errors at the receiver.

According to certain aspects, a processor readable storage medium may have instructions stored thereon. The instructions may be executable by the processor. The instructions may include instructions for receiving a sequence of symbols representative of the signaling state of a plurality of connectors, and decoding the sequence of symbols. In one example, the instructions may include instructions for converting the sequence of symbols into a transition number, each digit of the transition number representing a transition between two consecutive symbols transmitted on the plurality of connectors, and converting the transition number into a received plurality of bits. The instructions may include instructions for determining whether a symbol error is present in the sequence of symbols based on a value of an EDC in the received plurality of bits, and when the symbol error is determined to be present in the sequence of symbols generating one or more permutations of the sequence of symbols, each permutation including one symbol that is different from corresponding symbols in the sequence of symbols and different from corresponding symbols in other permutations, decoding the one or more permutations, and identifying a permutation as a corrected sequence of symbols when it produces a decoded EDC value that matches an expected EDC value. The expected EDC value may correspond to a predefined value for EDCs transmitted over the multi-wire interface to enable detection of up to two symbol errors at the receiver.

DRAWINGS

Various features, nature, and advantages may become apparent from the detailed description set forth below when taken in conjunction with the drawings in which like reference characters identify correspondingly throughout.

FIG. 11 tabulates values of $r^n$, where n lies in the range 0-15, and when r=3 and r=5.

Figure 12:
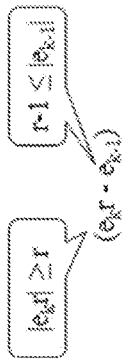

FIG. 12 tabulates error coefficients corresponding to a single symbol error in a sequence of symbols.

FIG. 13 illustrates the longest non-zero LSB portion in an error coefficient.

Figure 14:
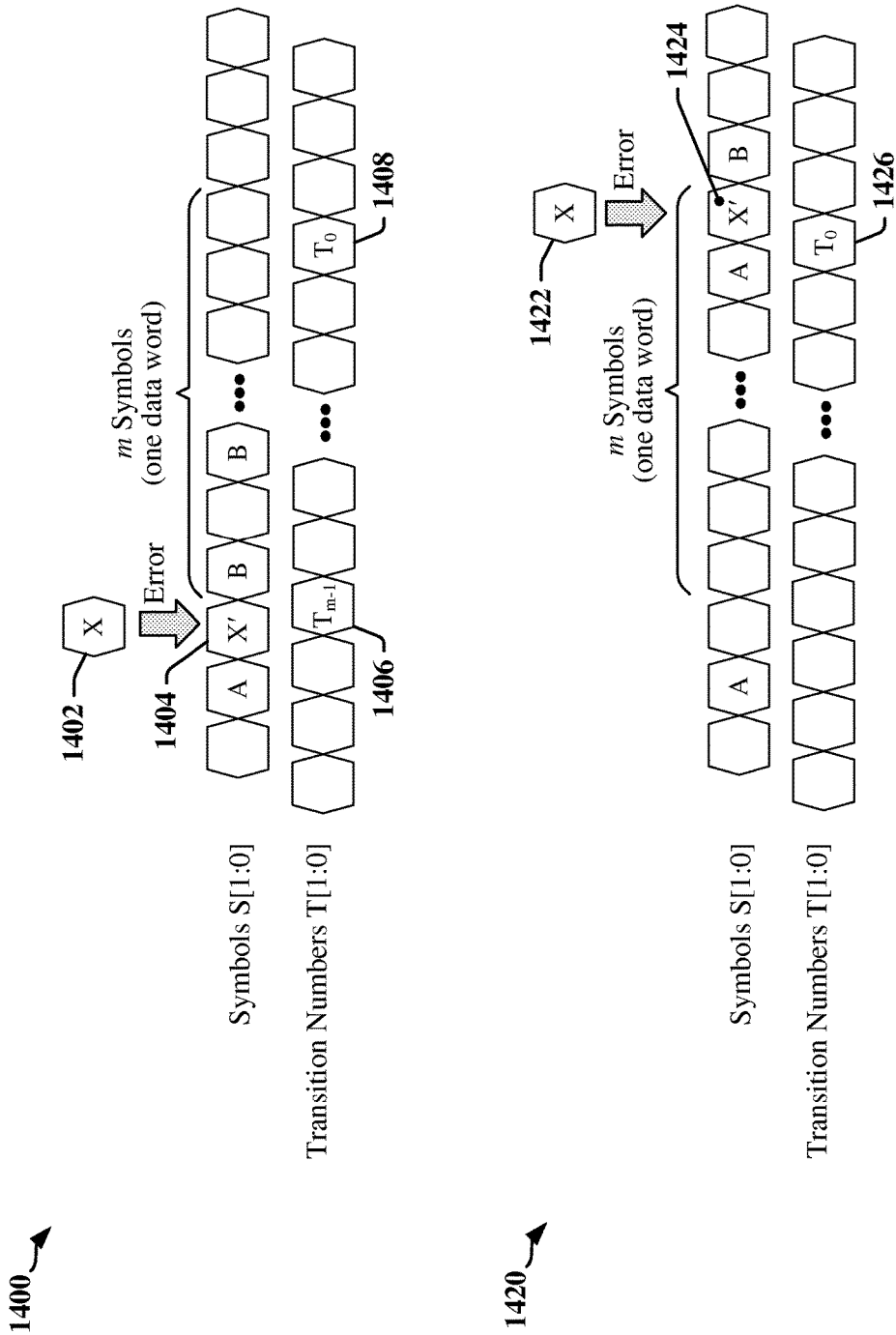

FIG. 14 illustrates cases in which a single symbol error results in an error in a single transition number.

Figure 15:
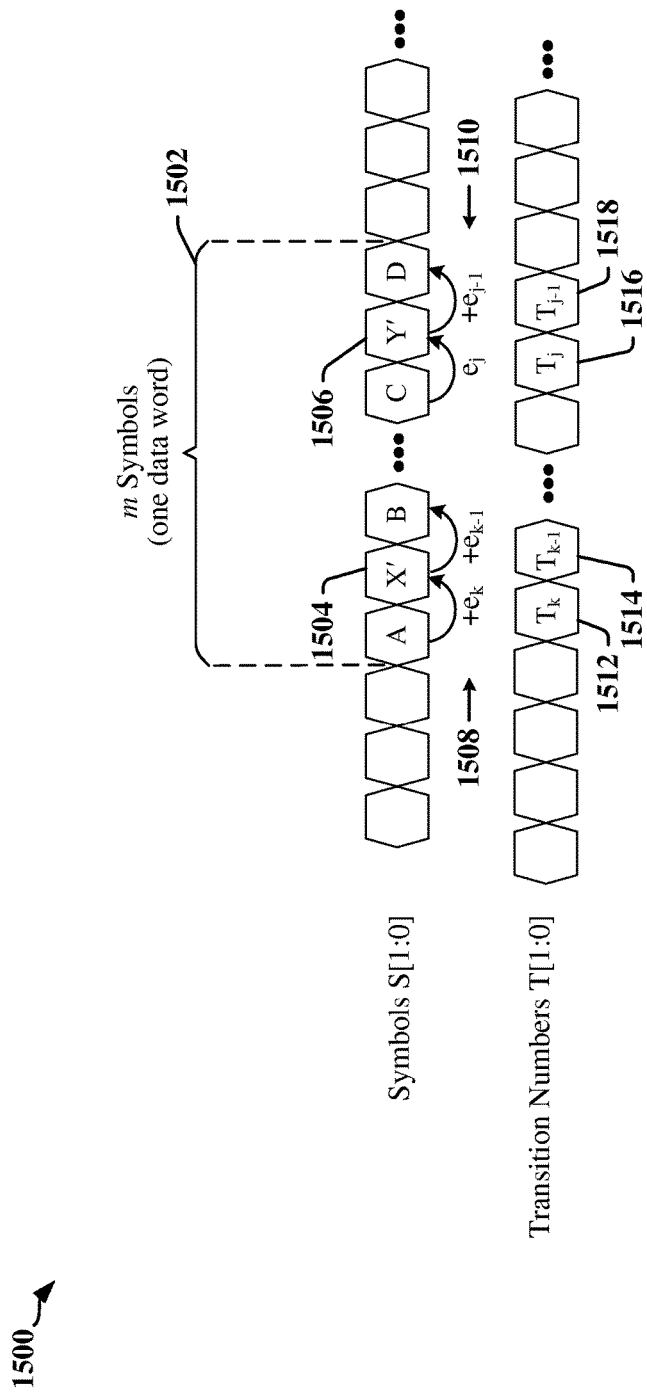

FIG. 15 illustrates a first example of signaling errors affecting two symbols in a sequence of symbols transmitted over a multi-wire communication interface.

Figure 16:
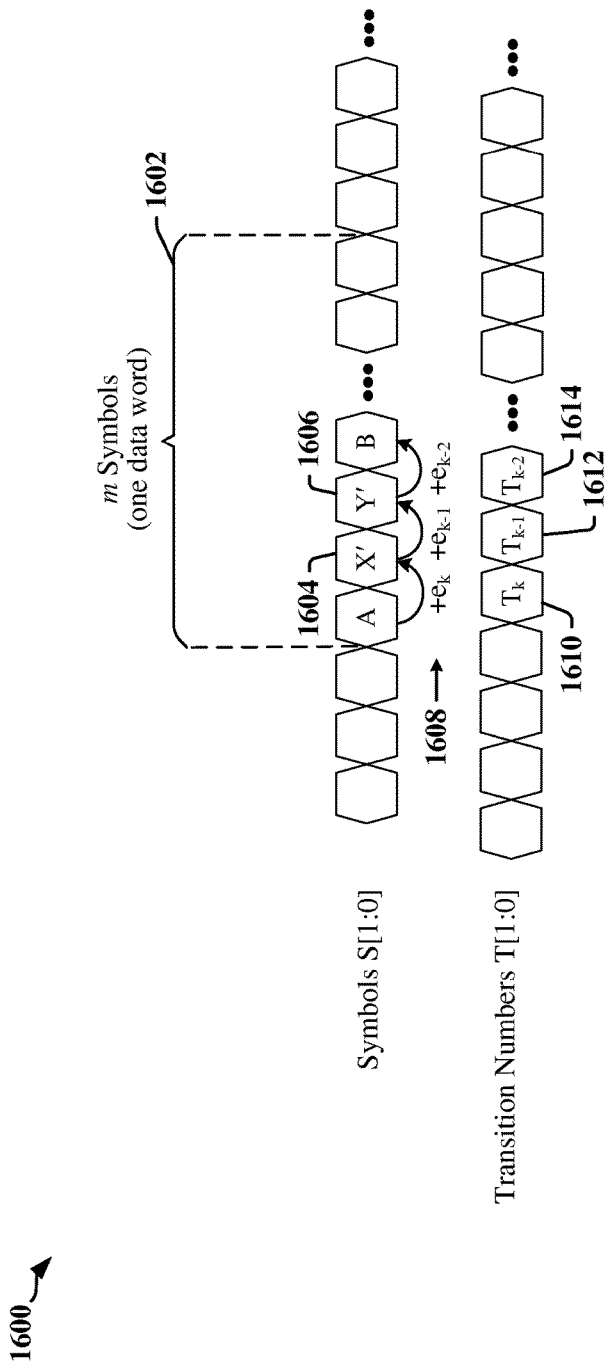

FIG. 16 illustrates a second example of signaling errors that affect two consecutive symbols transmitted over a multi-wire communication interface.

FIG. 17 illustrates the number of bits provided in an EDC for detection of two symbol errors in accordance with certain aspects disclosed herein.

Figure 18:
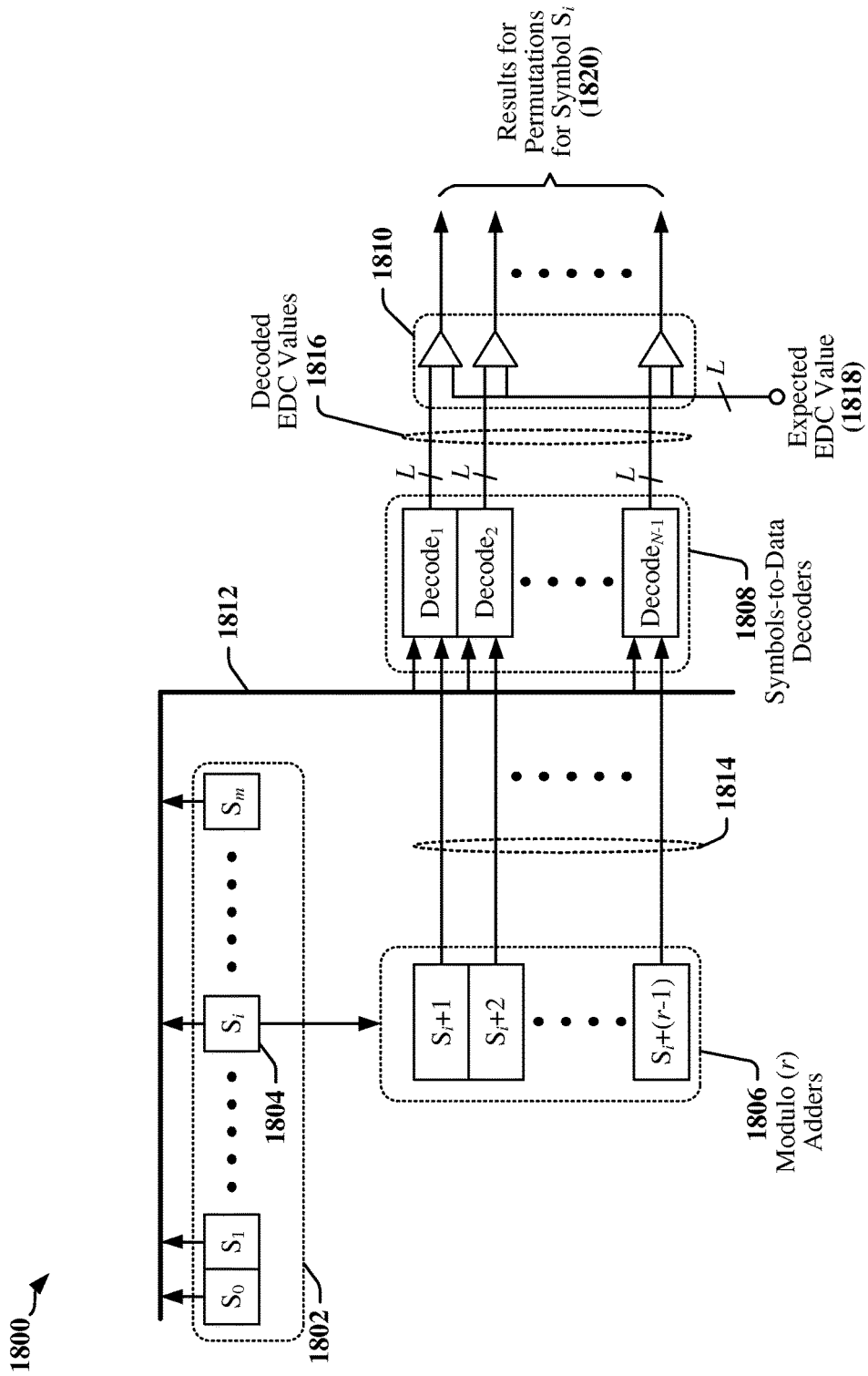

FIG. 18 illustrates the operation of a circuit that may be used to correct a single symbol error in accordance with certain aspects disclosed herein.

Figure 19:
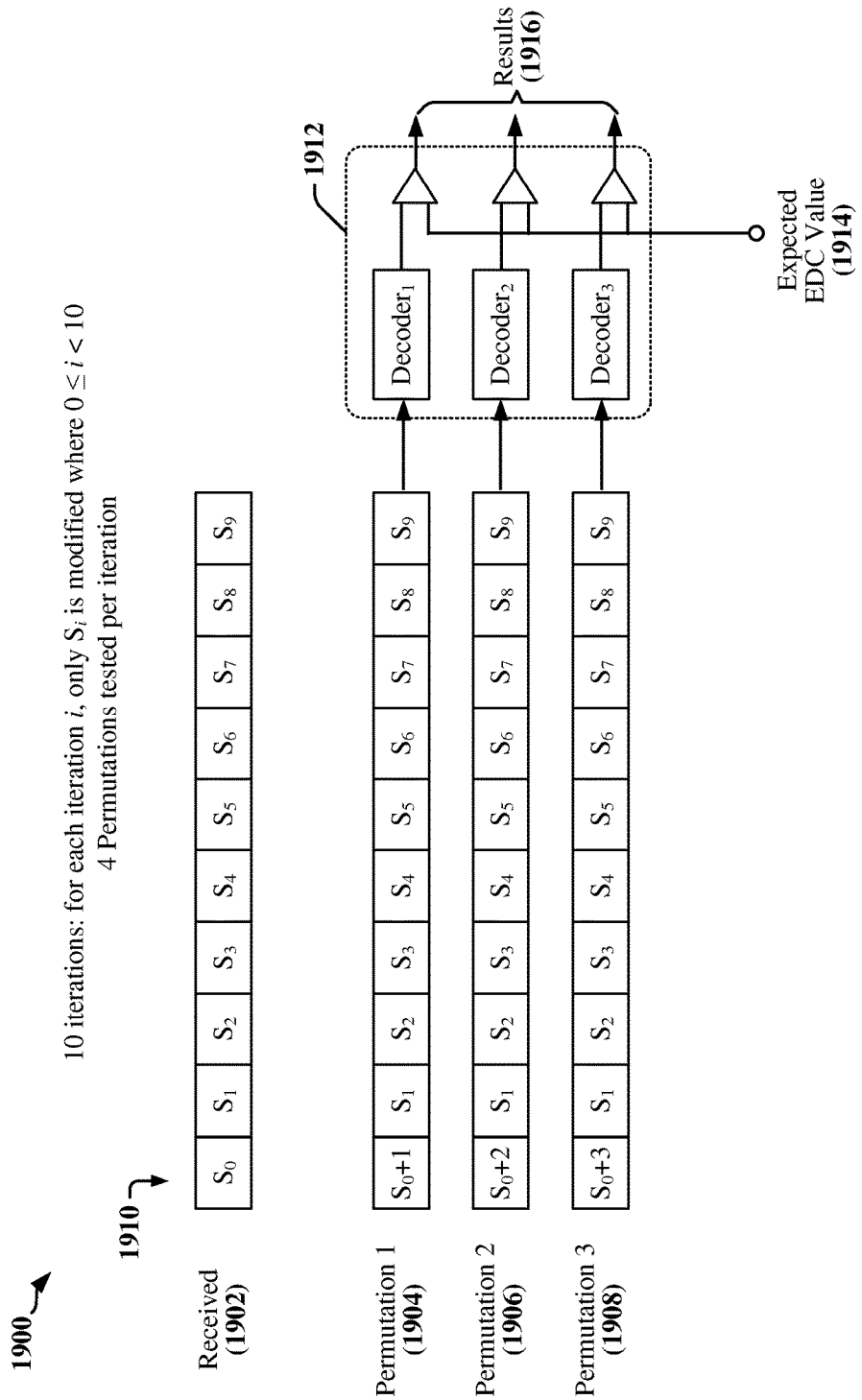

FIG. 19 illustrates a first configuration of decoders that may be used to correct symbol errors in accordance with certain aspects disclosed herein.

Figure 20:
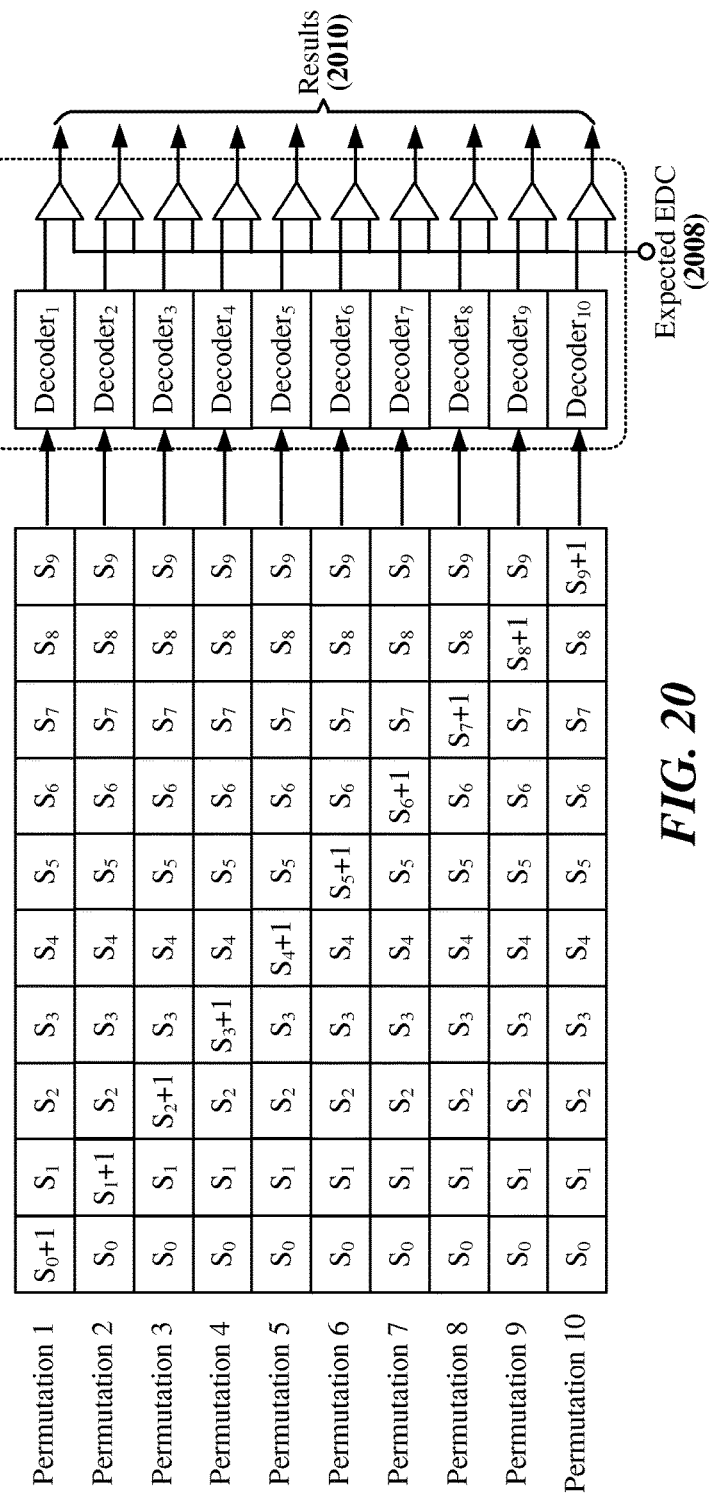

FIG. 20 illustrates a second configuration of decoders that may be used to correct symbol errors in accordance with certain aspects disclosed herein.

Figure 21:
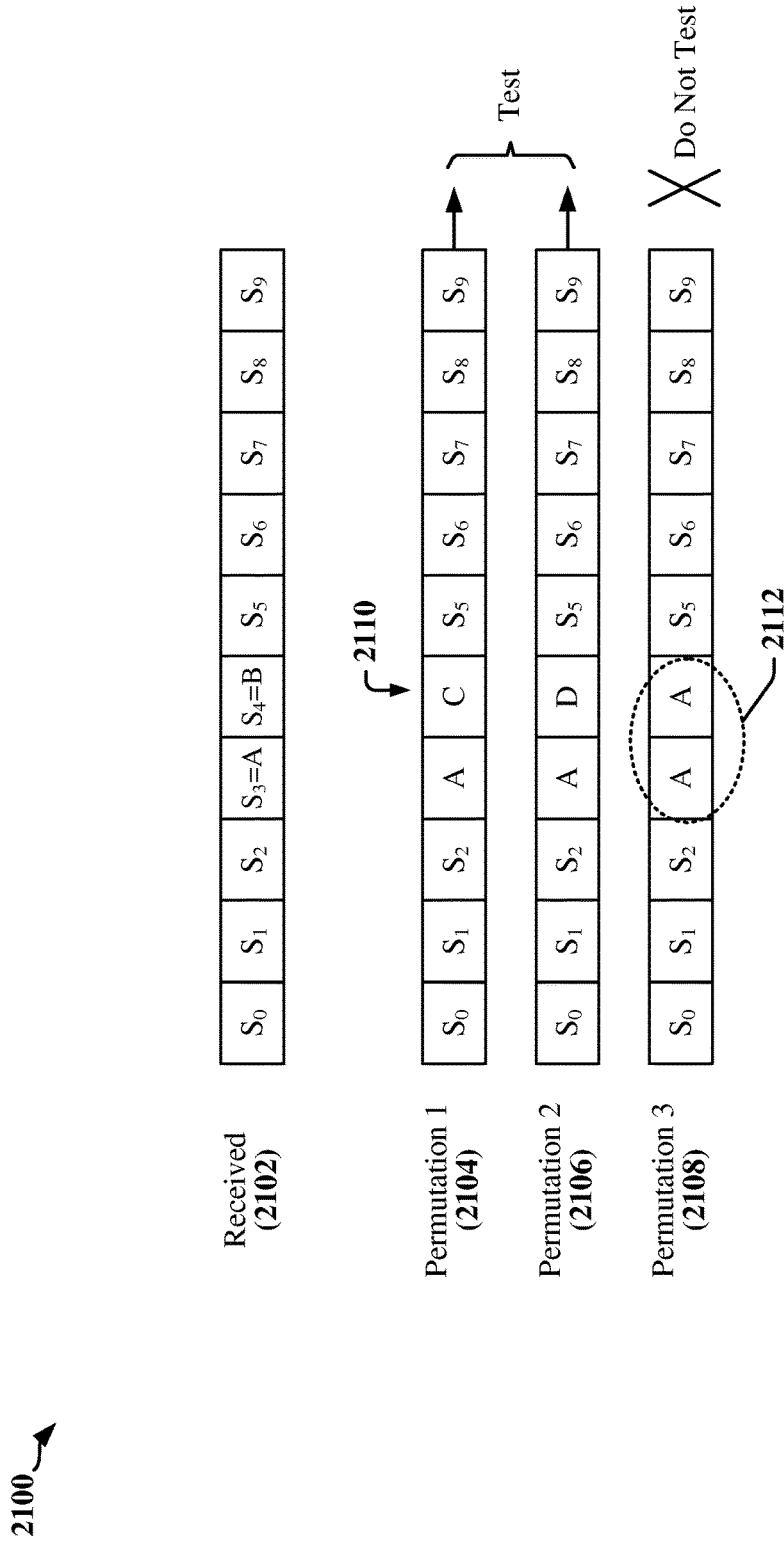

FIG. 21 illustrates certain aspects of decoders used to correct symbol errors that may exploited to reduce decoding overhead in accordance with certain aspects disclosed herein.

Figure 22:
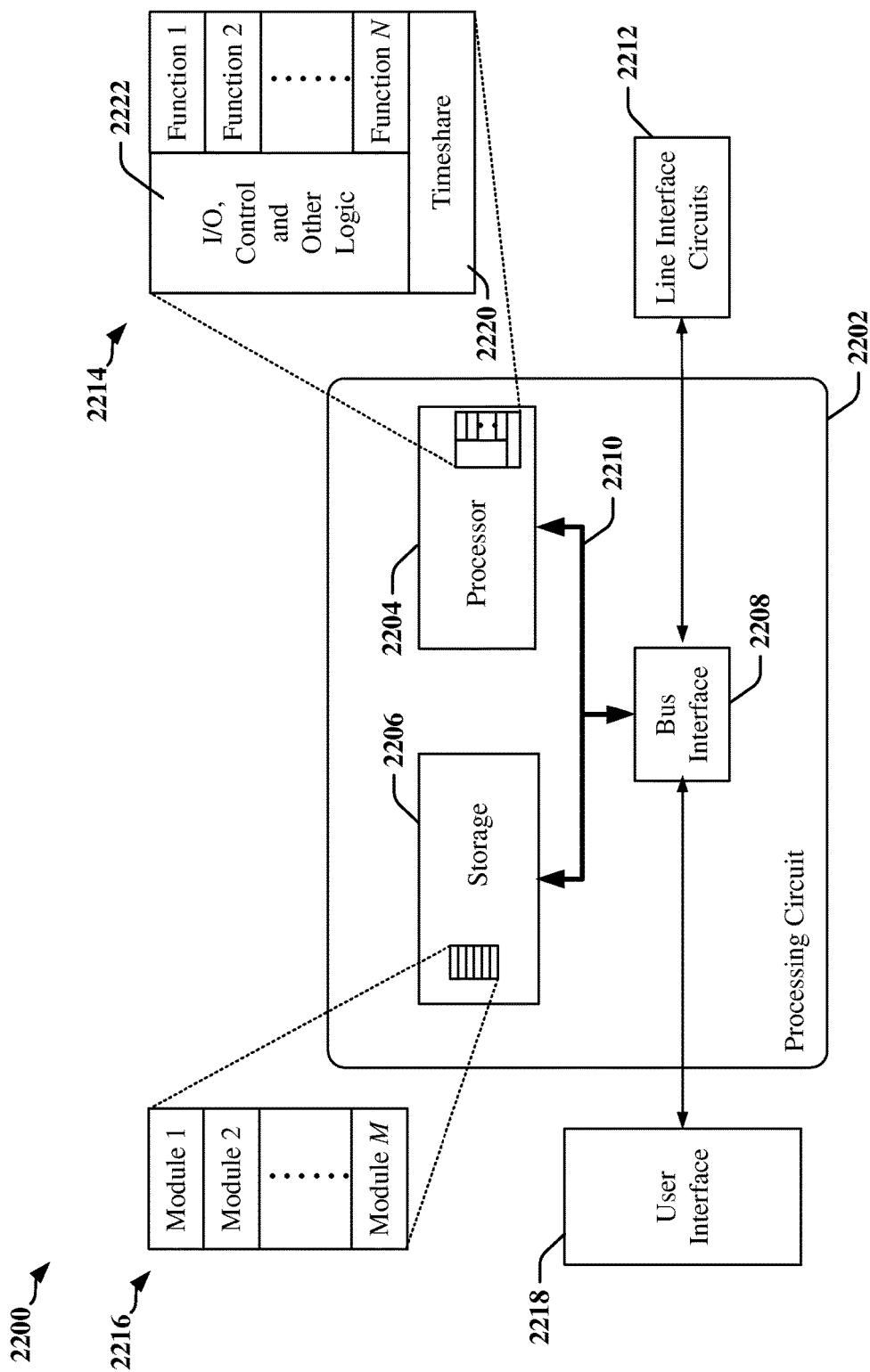

FIG. 22 is a block diagram illustrating an example of an apparatus employing a processing system that may be adapted according to certain aspects disclosed herein.

Figure 23:
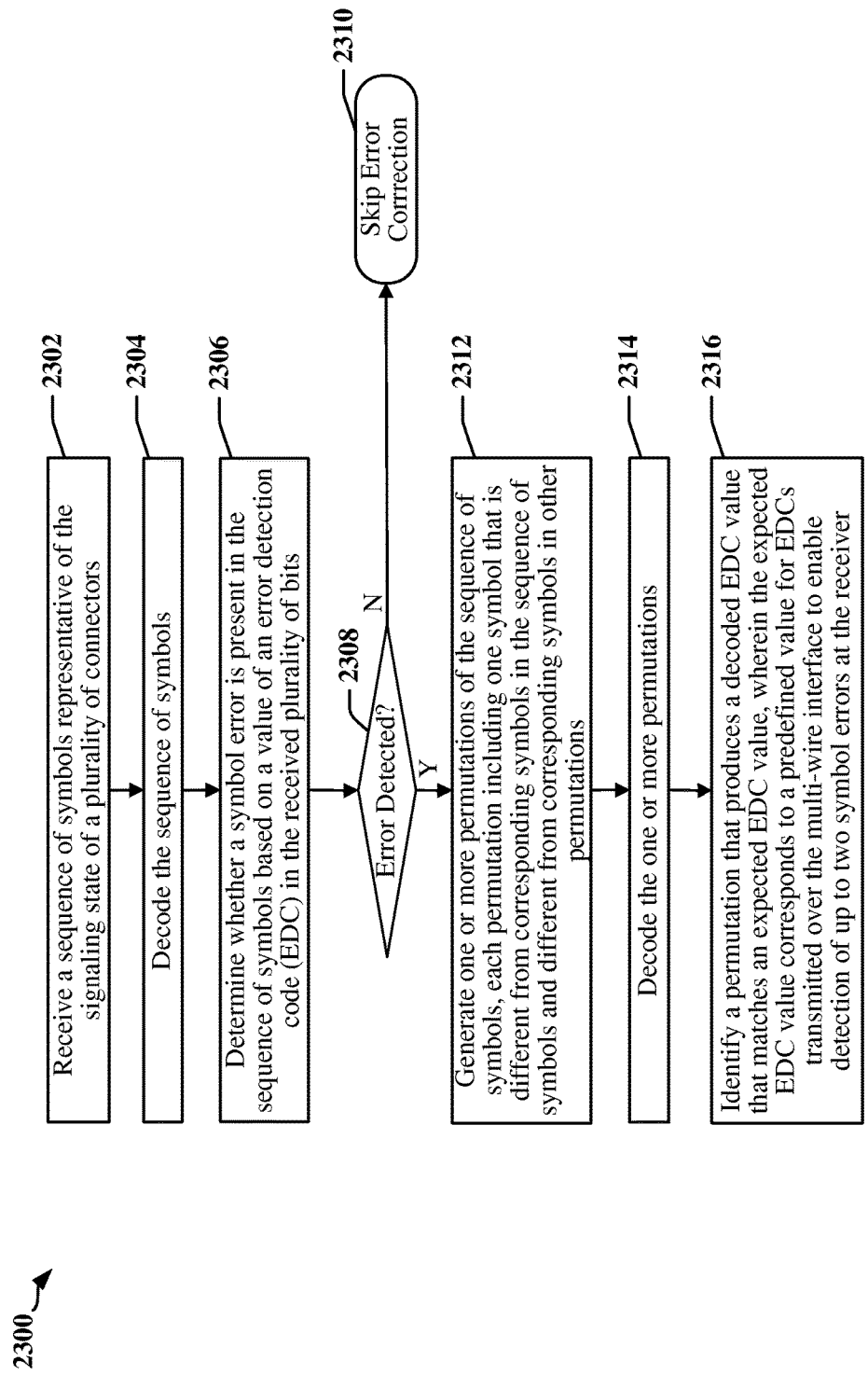

FIG. 23 is a flow chart of a method for correcting a symbol error in accordance with certain aspects disclosed herein.

Figure 24:
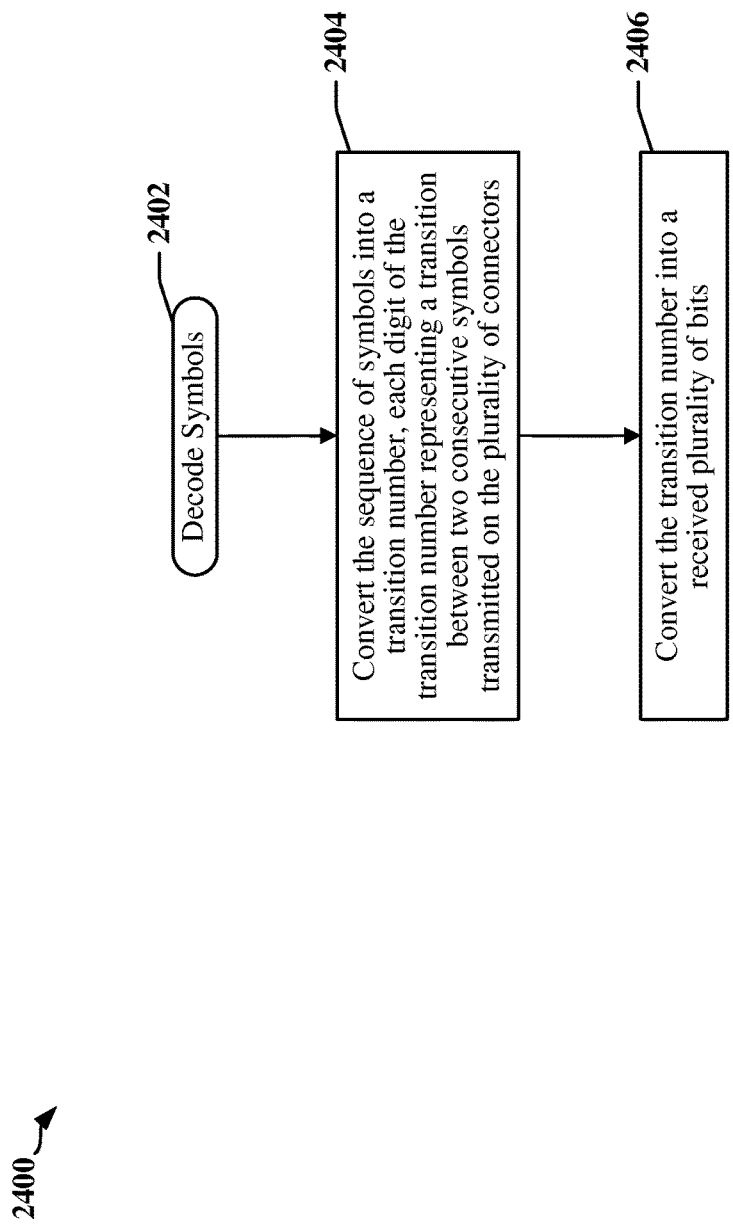

FIG. 24 is a flow chart illustrating an example of a method for decoding symbols in accordance with certain aspects disclosed herein.

Figure 25:
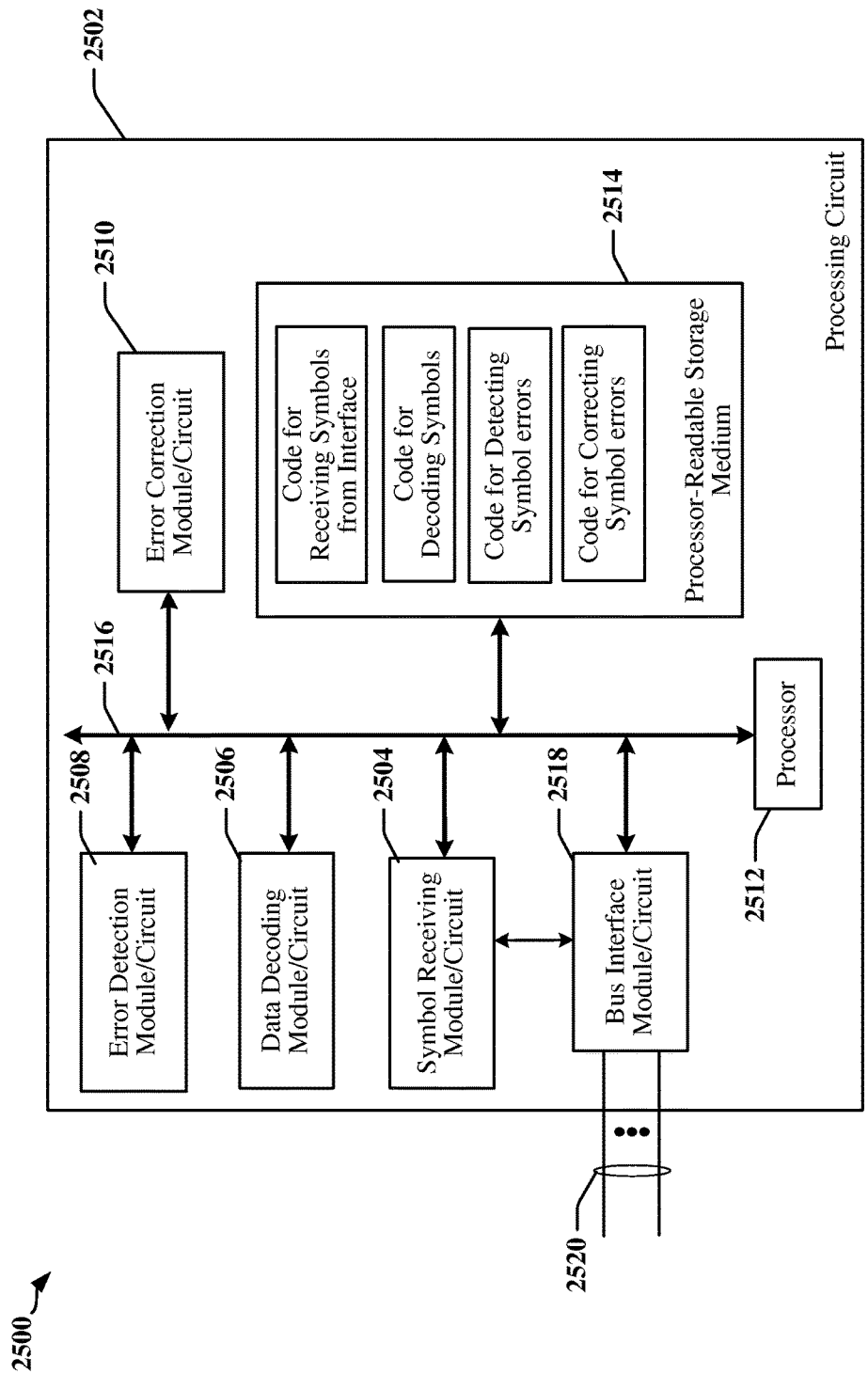

FIG. 25 is a diagram illustrating a second example of a hardware implementation for an apparatus used in an interface that provides symbol error detection according to certain aspects disclosed herein.

DETAILED DESCRIPTION

In the following description, specific details are given to provide a thorough understanding of the embodiments. However, it will be understood by one of ordinary skill in the art that the embodiments may be practiced without these specific detail. For example, circuits may be shown in block diagrams in order not to obscure the embodiments in unnecessary detail. In other instances, well-known circuits, structures, and techniques may not be shown in detail in order not to obscure the embodiments.

Overview

Certain data transfer interfaces employ transition encoding, including 3-phase and N! multi-wire LVDS interfaces, and multi-wire single-ended interfaces including the CCIe interface. Transition encoding embeds clock information in signaling states transmitted over the interface. In certain instances, data is transcoded to transition numbers, where each transition number selects a next symbol to be transmitted after a current symbol. Each symbol may represent signaling state of the interface. For example, the transition number may represent an offset used to select between symbols in an ordered set of symbols that can be transmitted on the interface. By ensuring that consecutive symbols are different from one another, a change in signaling state of the interface occurs at each symbol boundary providing information used to generate a receive clock at the receiver.

Errors in signaling state that change a transmitted symbol $S_1$ to a received symbol $Se_1$ can cause a receiver to produce an incorrect transition number $T_1+e_1$ associated with the transition between an immediately preceding symbol $S_2$ and the changed symbol $Se_1$. $T_1$ represents the difference between $S_2$ and the correctly transmitted symbol $S_1$, and $e_1$ is the value of an offset introduced by the signaling error. A second incorrect transition number $T_0+e_0$ is associated with the changed symbol $Se_1$, where $T_0$ represents the difference between the correctly transmitted symbol $S_1$ and a next symbol $S_0$, with $e_0$ representing the value of the offset introduced by the signaling error. The values of $e_1$ and $e_0$ do not directly correspond to the error in signaling state, and the disassociation between data bit errors and signaling state errors can render conventional error detection techniques ineffective when applied to transition encoding interfaces.

According to certain aspects disclosed herein, reliable error detection is enabled in transition-encoded interfaces by providing an error detection constant (EDC) that can detect two symbol errors in a sequence of symbols that is used to transmit a word of data. The EDC may include a predefined number of bits having a known, fixed value. The value of the EDC may have a zero value, in one example, and may be provided as a predefined or preselected number of least significant bits (LSBs) appended to each word to be transmitted on the multi-wire interface.

According to certain aspects, a single symbol error per transmitted data word may be corrected. In one example, an EDC appended to a data word may be capable of detecting two symbol errors, and this capability may be leveraged to implement an error correction scheme that is effective for correcting a single symbol error. In operation, a receiver may monitor the EDC value in decoded words and determine that at least one symbol error has occurred when, for example, the EDC has an unexpected value. Error correction may be attempted when an error is detected.

An error correction scheme may operate by testing different changes in the value of each symbol in the received sequence of symbols corresponding to the received data word that is associated with an EDC that does not match the predefined value inserted by the transmitter. For example, permutations of the sequence of symbols are decoded with alternative values of one symbol while the other symbols are unmodified. Error correction may be accomplished when a modified symbol causes the EDC appended to the resultant decoded data word to match the predefined value expected for an EDC after error-free transmission. Since the EDC detects two symbol errors, any modifications made by error correction logic to a correctly-received symbol introduces a second symbol error into the sequence of symbols, that may be detected by comparing EDC values.

Example of a Device Employing Transition Encoding

Figure 1:
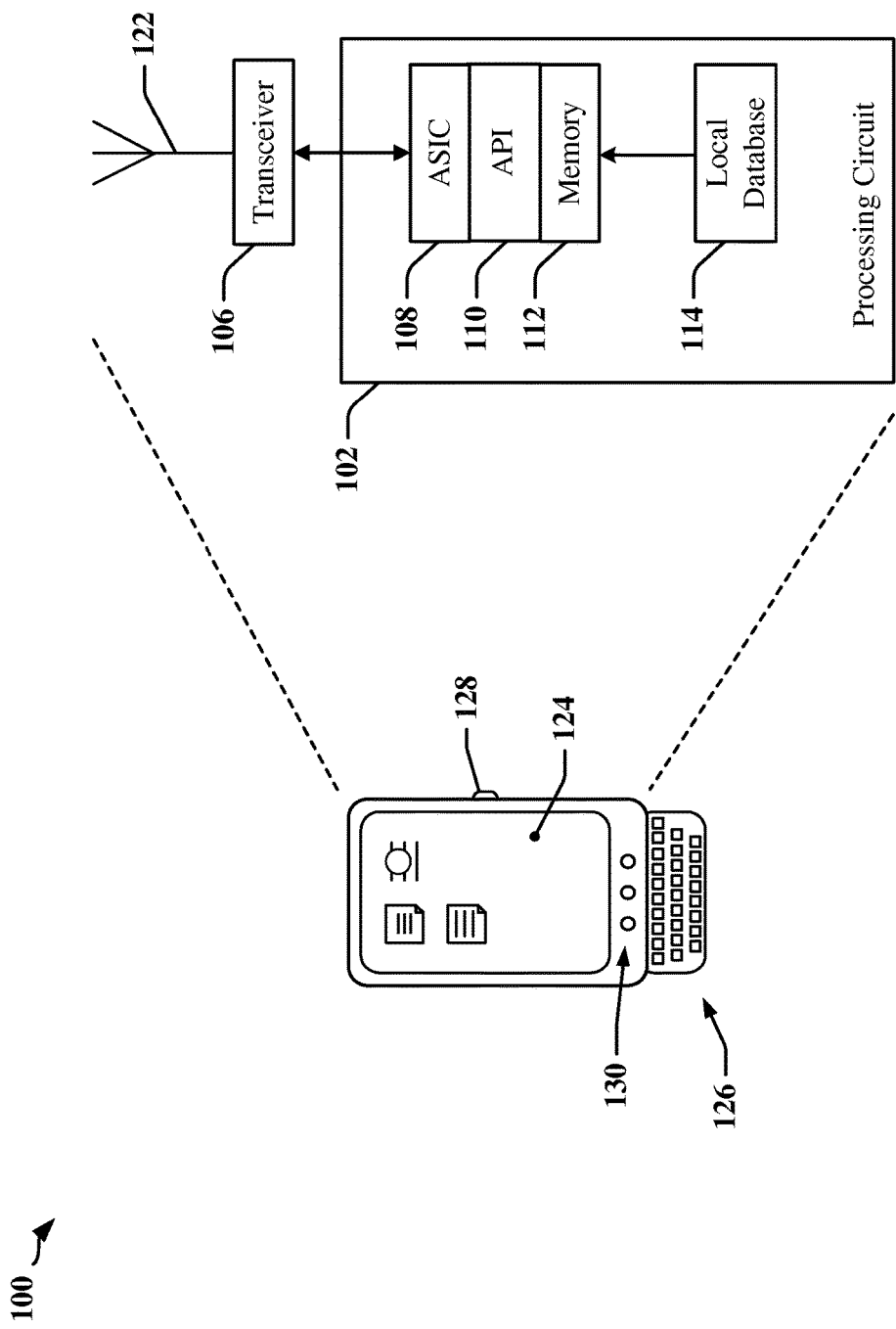
FIG. 1 depicts an apparatus employing a data link between IC devices that selectively operates according to one of a plurality of available standards.

FIG. 1 depicts one example of an apparatus 100 that employs a communication link between IC devices. In one example, the apparatus 100 may include a wireless communication device that communicates through an RF transceiver with a radio access network (RAN), a core access network, the Internet and/or another network. The apparatus 100 may include a communications transceiver 106 operably coupled to processing circuit 102. The processing circuit 102 may include one or more IC devices, such as an application-specific IC (ASIC) 108. The ASIC 108 may include one or more processing devices, logic circuits, and so on. The processing circuit 102 may include and/or be coupled to processor readable storage such as a memory device 112 that may maintain instructions and data that may be executed by processing circuit 102. The processing circuit 102 may be controlled by one or more of an operating system and an application programming interface (API) 110 layer that supports and enables execution of software modules residing in storage media, such as the memory device 112 of the wireless device. The memory device 112 may include read-only memory (ROM) or random-access memory (RAM), electrically erasable programmable ROM (EEPROM), flash cards, or any memory device that can be used in processing systems and computing platforms. The processing circuit 102 may include or access a local database 114 that can maintain operational parameters and other information used to configure and operate the apparatus 100. The local database 114 may be implemented using one or more of a database module, flash memory, magnetic media, EEPROM, optical media, tape, soft or hard disk, or the like. The processing circuit may also be operably coupled to external devices such as an antenna 122, a display 124, operator controls, such as button 128 and keypad 126 among other components.

Figure 2:
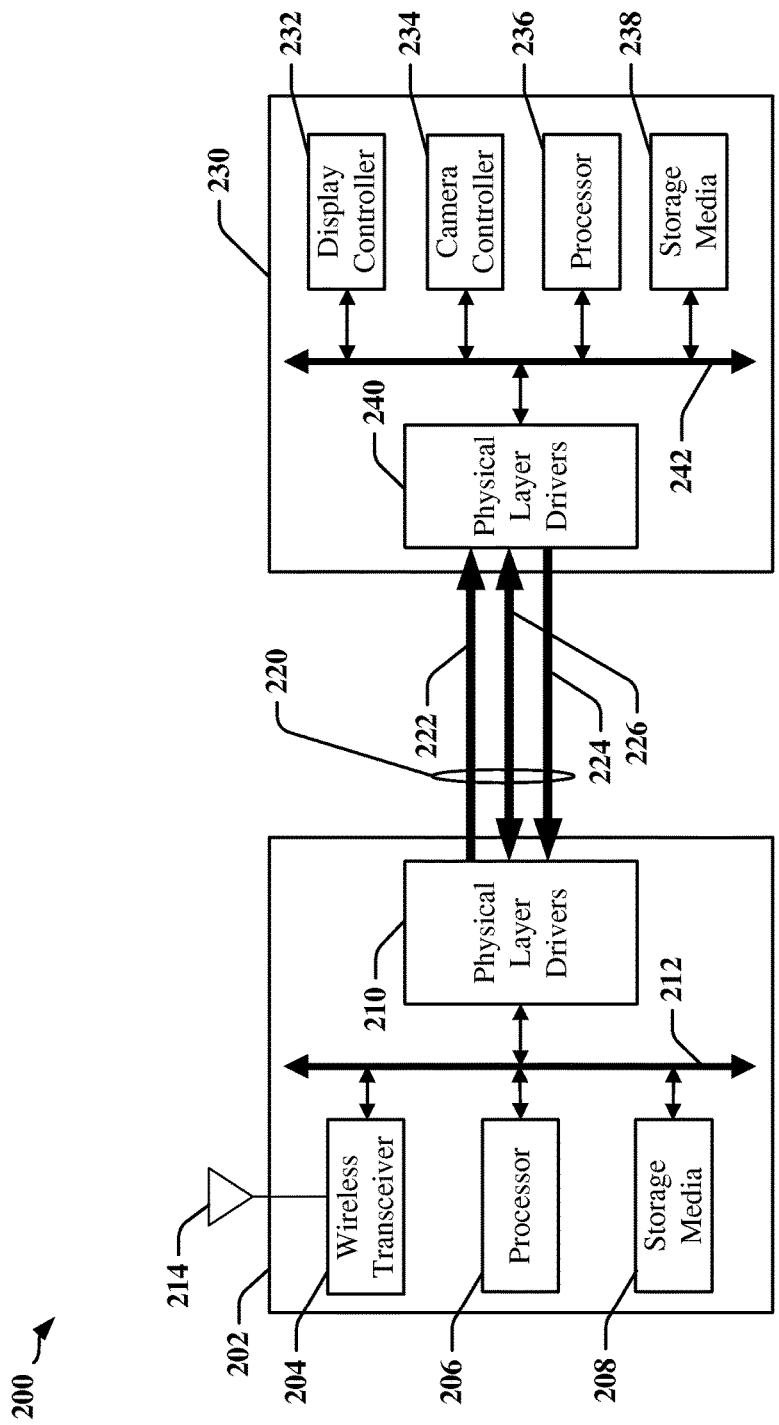
FIG. 2 illustrates a system architecture for an apparatus employing a data link between IC devices.

FIG. 2 is a block schematic drawing illustrating certain aspects of an apparatus 200 connected to a communication link 220, where the apparatus 200 may be embodied in one or more of a wireless mobile device, a mobile telephone, a mobile computing system, a wireless telephone, a notebook computer, a tablet computing device, a media player, s gaming device, or the like. The apparatus 200 may include a plurality of IC devices 202 and 230 that exchange data and control information through a communication link 220. The communication link 220 may be used to connect IC devices 202 and 230 that are located in close proximity to one another, or physically located in different parts of the apparatus 200. In one example, the communication link 220 may be provided on a chip carrier, substrate or circuit board that carries the IC devices 202 and 230. In another example, a first IC device 202 may be located in a keypad section of a flip-phone while a second IC device 230 may be located in a display section of the flip-phone. In another example, a portion of the communication link 220 may include a cable or optical connection.

The communication link 220 may include multiple channels 222, 224 and 226. One or more channels 226 may be bidirectional, and may operate in half-duplex and/or full-duplex modes. One or more channels 222 and 224 may be unidirectional. The communication link 220 may be asymmetrical, providing higher bandwidth in one direction. In one example described herein, a first communication channel 222 may provide or be referred to as a forward link while a second communication channel 224 may provide or be referred to as a reverse link. The first IC device 202 may be designated as a host system or transmitter, while the second IC device 230 may be designated as a client system or receiver, even if both IC devices 202 and 230 are configured to transmit and receive on the communication channel 222. In one example, a forward link may operate at a higher data rate when communicating data from a first IC device 202 to a second IC device 230, while a reverse link may operate at a lower data rate when communicating data from the second IC device 230 to the first IC device 202.

The IC devices 202 and 230 may each have a processor 206, 236 and/or a processing and/or computing circuit or other such device or circuit. In one example, the first IC device 202 may perform core functions of the apparatus 200, including maintaining wireless communications through a wireless transceiver 204 and an antenna 214, while the second IC device 230 may support a user interface that manages or operates a display controller 232. The first IC device 202 or second IC device 230 may control operations of a camera or video input device using a camera controller 234. Other features supported by one or more of the IC devices 202 and 230 may include a keyboard, a voice-recognition component, and other input or output devices. The display controller 232 may include circuits and software drivers that support displays such as a liquid crystal display (LCD) panel, touch-screen display, indicators and so on. The storage media 208 and 238 may include transitory and/or non-transitory storage devices adapted to maintain instructions and data used by respective processors 206 and 236, and/or other components of the IC devices 202 and 230. Communication between each processor 206, 236 and its corresponding storage media 208 and 238 and other modules and circuits may be facilitated by one or more bus 212 and 242, respectively.

The reverse link (here, the second communication channel 224) may be operated in the same manner as the forward link (here, the first communication channel 222), and the first communication channel 222 and second communication channel 224 may be capable of transmitting at comparable speeds or at different speeds, where speed may be expressed as data transfer rate and/or clocking rates. The forward and reverse data rates may be substantially the same or differ by orders of magnitude, depending on the application. In some applications, a single bidirectional link (here, the third communication channel 226) may support communications between the first IC device 202 and the second IC device 230. The first communication channel 222 and/or second communication channel 224 may be configurable to operate in a bidirectional mode when, for example, the forward and reverse links share the same physical connections and operate in a half-duplex manner. In one example, the communication link 220 may be operated to communicate control, command and other information between the first IC device 202 and the second IC device 230 in accordance with an industry or other standard.

In one example, forward and reverse links may be configured or adapted to support a wide video graphics array (WVGA) 80 frames per second LCD driver IC without a frame buffer, delivering pixel data at 810 Mbps for display refresh. In another example, forward and reverse links may be configured or adapted to enable communications between with dynamic random access memory (DRAM), such as double data rate synchronous dynamic random access memory (SDRAM). Encoding devices 210 and/or 230 can encode multiple bits per clock transition, and multiple sets of wires can be used to transmit and receive data from the SDRAM, control signals, address signals, and so on.

Forward and reverse channels may comply or be compatible with application-specific industry standards. In one example, the MIPI standard defines physical layer interfaces between an IC device 202 that includes an application processor and an IC device 230 that controls and/or supports the camera or display in a mobile device. The MIPI standard includes specifications that govern the operational characteristics of products that comply with MIPI specifications for mobile devices. The MIPI standard may define interfaces that employ complimentary metal-oxide-semiconductor (CMOS) parallel busses.

In one example, the communication link 220 of FIG. 2 may be implemented as a wired bus that includes a plurality of signal wires (denoted as N wires). The N wires may be configured to carry data encoded in symbols, where each symbol defines a signaling state of the N wires, and where clock information is embedded in a sequence of the symbols transmitted over the plurality of wires.

Figure 3:
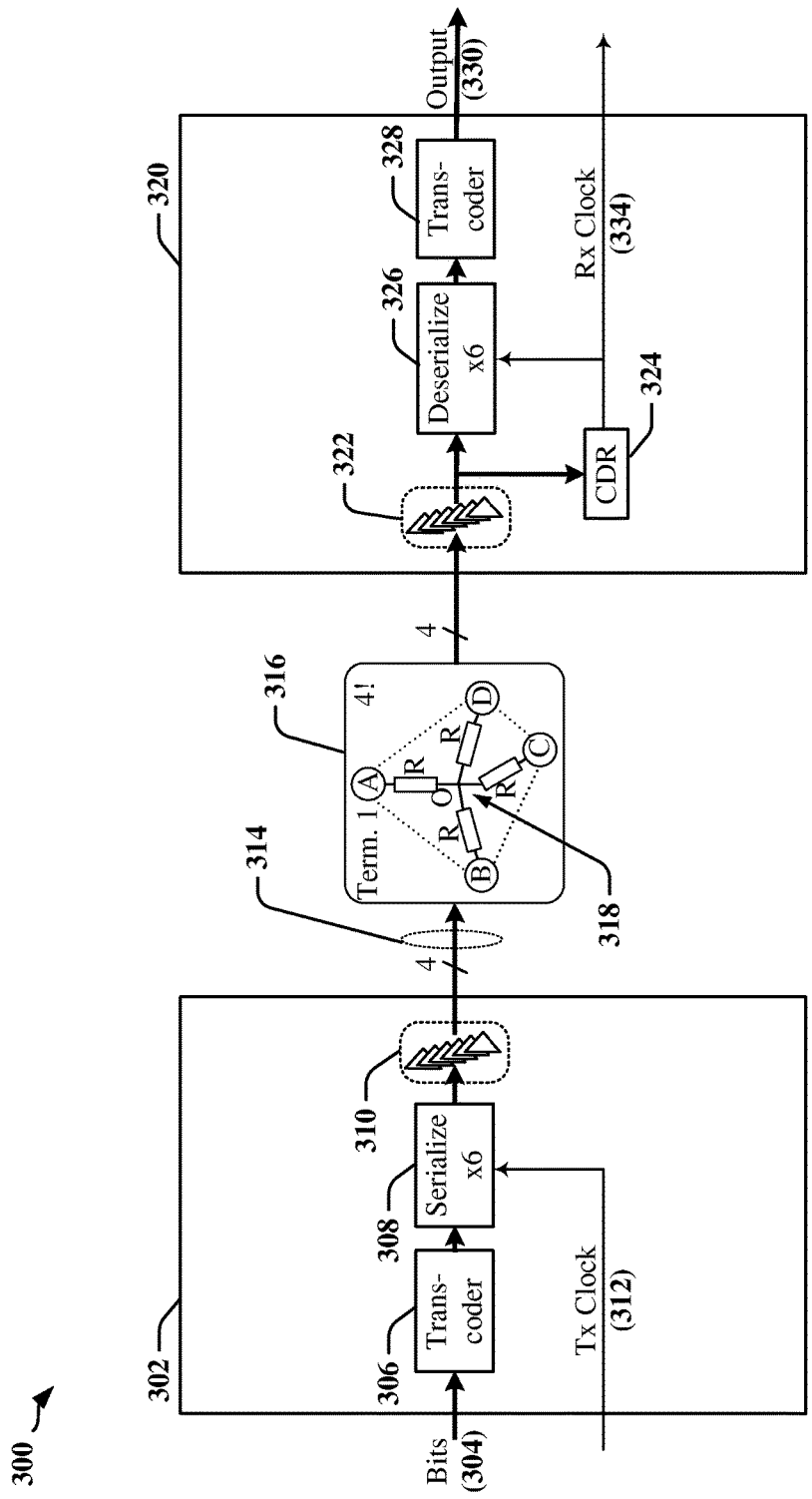
FIG. 3 illustrates an example of an N! interface provided between two devices.

FIG. 3 is a diagram illustrating one example of an N-wire interface 300 provided between two devices. At a transmitter 302, a transcoder 306 may be used to encode data bits 304 and clock information in symbols to be transmitted over a set of N wires 314 using N-factorial (N!) encoding. The clock information is derived from a transmit clock 312 and may be encoded in a sequence of symbols transmitted in $_NC_2$ differential signals over the N wires 314 by ensuring that a signaling state transition occurs on at least one of the $_NC_2$ signals between consecutive symbols. When N! encoding is used to drive the N wires 314, each bit of a symbol is transmitted as a differential signal by one of a set of differential line drivers 310, where the differential drivers in the set of differential line drivers 310 are coupled to different pairs of the N wires. The number of available combinations of wire pairs ($_NC_2$) determines the number of signals that can be transmitted over the N wires 314. The number of data bits 304 that can be encoded in a symbol may be calculated based on the number of available signaling states available for each symbol transmission interval.

A termination impedance (typically resistive) couples each of the N wires 314 to a common center point 318 in a termination network 316. It will be appreciated that the signaling states of the N wires 314 reflects a combination of the currents in the termination network 316 attributed to the differential line drivers 310 coupled to each wire. It will be further appreciated that the center point 318 is a null point, whereby the currents in the termination network 316 cancel each other at the center point.

The N! encoding scheme need not use a separate clock channel and/or non-return-to-zero decoding because at least one of the $_NC_2$ signals in the link transitions between consecutive symbols. Effectively, the transcoder 306 ensures that a transition occurs between each pair of symbols transmitted on the N wires 314 by producing a sequence of symbols in which each symbol is different from its immediate predecessor symbol. In the example depicted in FIG. 3, N=4 wires are provided, and the 4 wires can carry $_4C_2$=6 differential signals. The transcoder 306 may employ a mapping scheme to generate raw symbols for transmission on the N wires 314. The transcoder 306 may map data bits 304 to a set of transition numbers. The transition numbers may then be used to select a raw symbol for transmission based on the value of the preceding symbol such that the selected raw symbol is different from the preceding raw symbol. In one example, a transition number may be used to lookup a data value corresponding to the second of the consecutive raw symbols with reference to the first of the consecutive raw symbols. At the receiver 320, a transcoder 328 may employ a mapping to determine a transition number that characterizes a difference between a pair of consecutive raw symbols in a lookup table, for example. The transcoders 306, 328 operate on the basis that every consecutive pair of raw symbols includes two different symbols.

The transcoder 306 at the transmitter 302 may select between the N!−1 symbols that are available at every symbol transition. In one example, a 4! system provides 4!−1=23 signaling states for the next symbol to be transmitted at each symbol transition. The bit rate may be calculated as $\log_2$ (available_states) per transmit clock cycle. In a system using double data rate (DDR) clocking, whereby symbol transitions occur at both the rising edge and falling edge of the transmit clock 312, two symbols are transmitted per transmit clock cycle. The total available states in the transmit clock cycle for N=4 is $(N!-1)=(23)^2=529$ and the number of data bits 304 that can transmitted per symbol may be calculated as $\log_2(529)=9.047$ bits.

The receiver 320 receives the sequence of symbols using a set of line receivers 322 where each receiver in the set of line receivers 322 determines differences in signaling states on one pair of the N wires 314. Accordingly, $_NC_2$ receivers are used, where N represents the number of wires. The $_NC_2$ receivers produce a corresponding number of raw symbols as outputs. In the depicted N=4 wire example, the signals received on the four wires 314 are processed by 6 receivers ($_4C_2=6$) to produce a state transition signal that is provided to a corresponding CDR 324 and deserializer 326. The CDR 324 may produce a receive clock signal 334 that can be used by the deserializer 326. The receive clock signal 334 may be a DDR clock signal that can be used by external circuitry to receive data provided by the transcoder 328. The transcoder 328 decodes a block of received symbols from the deserializer 326 by comparing each next symbol to its immediate predecessor. The transcoder 328 produces output data 330 corresponding to the data bits 304 provided to the transmitter 302.

Transition Encoding Example

Figure 4:
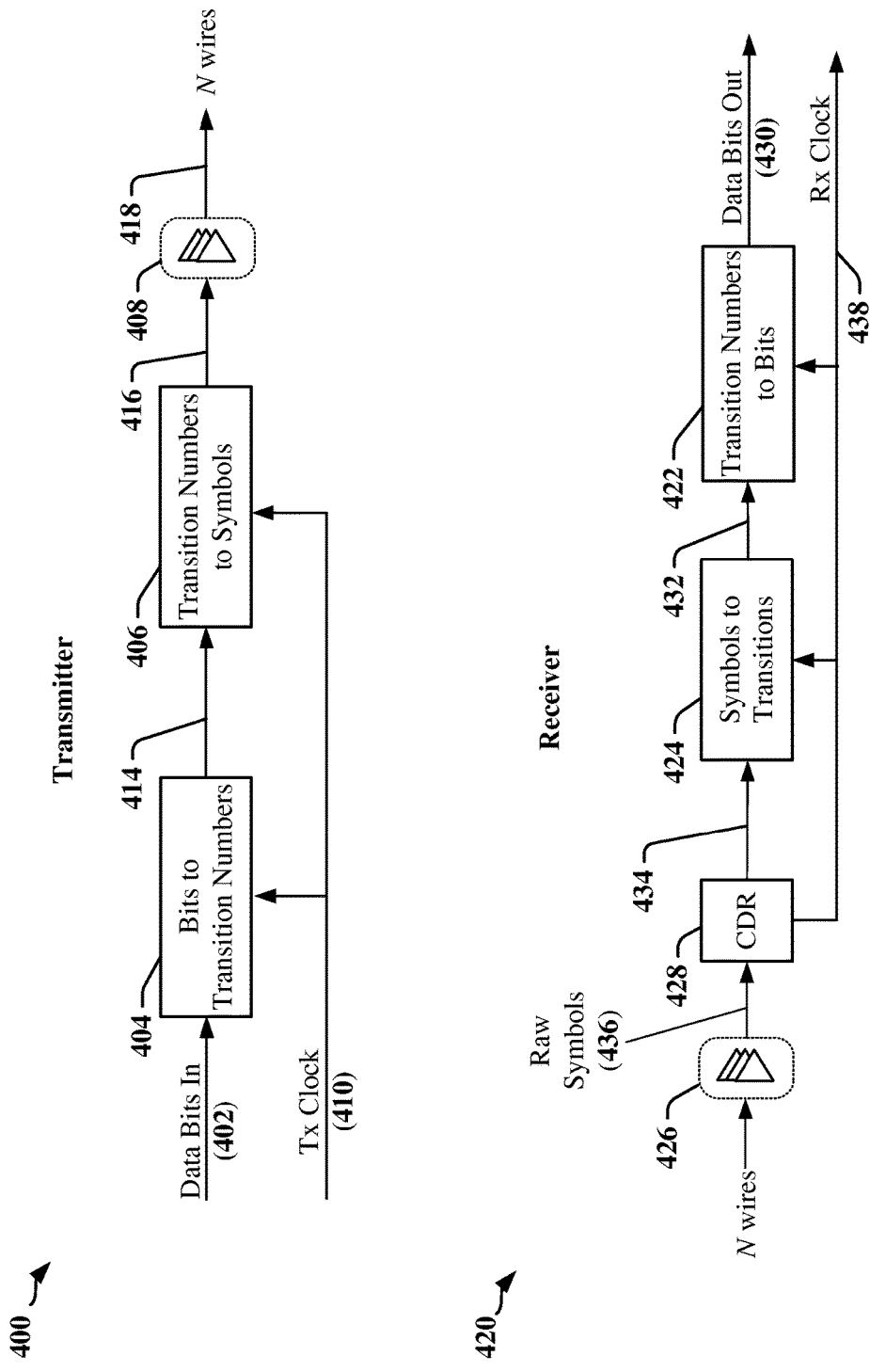
FIG. 4 illustrates a transmitter and a receiver that may be adapted according to certain aspects disclosed herein.

FIG. 4 is a block diagram illustrating a transmitter 400 and a receiver 420 configured according to certain aspects disclosed herein. The transmitter 400 and receiver 420 may be adapted for use with a variety of encoding techniques, including transition encoding used in N! and CCIe interfaces. The transmitter 400 includes a first converter 404 configured to convert data 402 into transition numbers 414. The transition numbers 414 may be used to select a next symbol for transmission based on the value of a current symbol, where the next symbol is different from a current symbol. A second converter, such as the encoder 406, receives the transition numbers and produces a sequence of symbols for transmission on the interface using suitably configured line drivers 408. Since no pair of consecutive symbols includes two identical symbols, a transition of signaling state occurs in at least one of the signal wires 418 of the interface at every symbol transition. At the receiver 420, a set of line receivers 426 provides raw symbols (SI) 436 to a CDR 428 that extracts a receive clock 438 and provides captured symbols (S) 434 to a circuit that converts the captured symbols 434 to transition numbers 432. The transition numbers may be decoded by a circuit 422 to provide output data 430.

In the example of a 3! system, the transmitter 400 may be configured or adapted to transcode data 402 into quinary (base-5) transition numbers 414 represented by 3 bits. In the example of a CCIe system, the transmitter 400 may be configured or adapted to transcode data 402 into ternary (base-3) transition numbers 414 represented by 2 bits. The transition numbers 414 may be encoded in a sequence of symbols 416 to be transmitted on the signal wires 418. The data 402 provided to the transmitter 400 may be one or more words, each word having 20-bits. The first converter 404, which may be a transcoder, receives the data 402 and produces a sequence of transition numbers 414 for each data element. The sequence of transition numbers 414 may include a sufficient number of ternary numbers to encode a predefined number of bits of data, error detection and other information. The encoder 406 produces a sequence of symbols 416 that are transmitted through line drivers 408. In one example, the line drivers 408 may include open-drain output transistors. In another example, the line drivers 408 may include push-pull drivers. The output sequence of symbols 416 generated by the encoder has a transition in the state of at least one of the signal wires 418 between each pair of consecutive symbols in the sequence of symbols 416 by ensuring that no pair of consecutive symbols include two identical symbols. The availability of a transition of state in at least one of the signal wires permits a receiver 420 to extract a receive clock 438 from the sequence of symbols 416.

Figure 5:
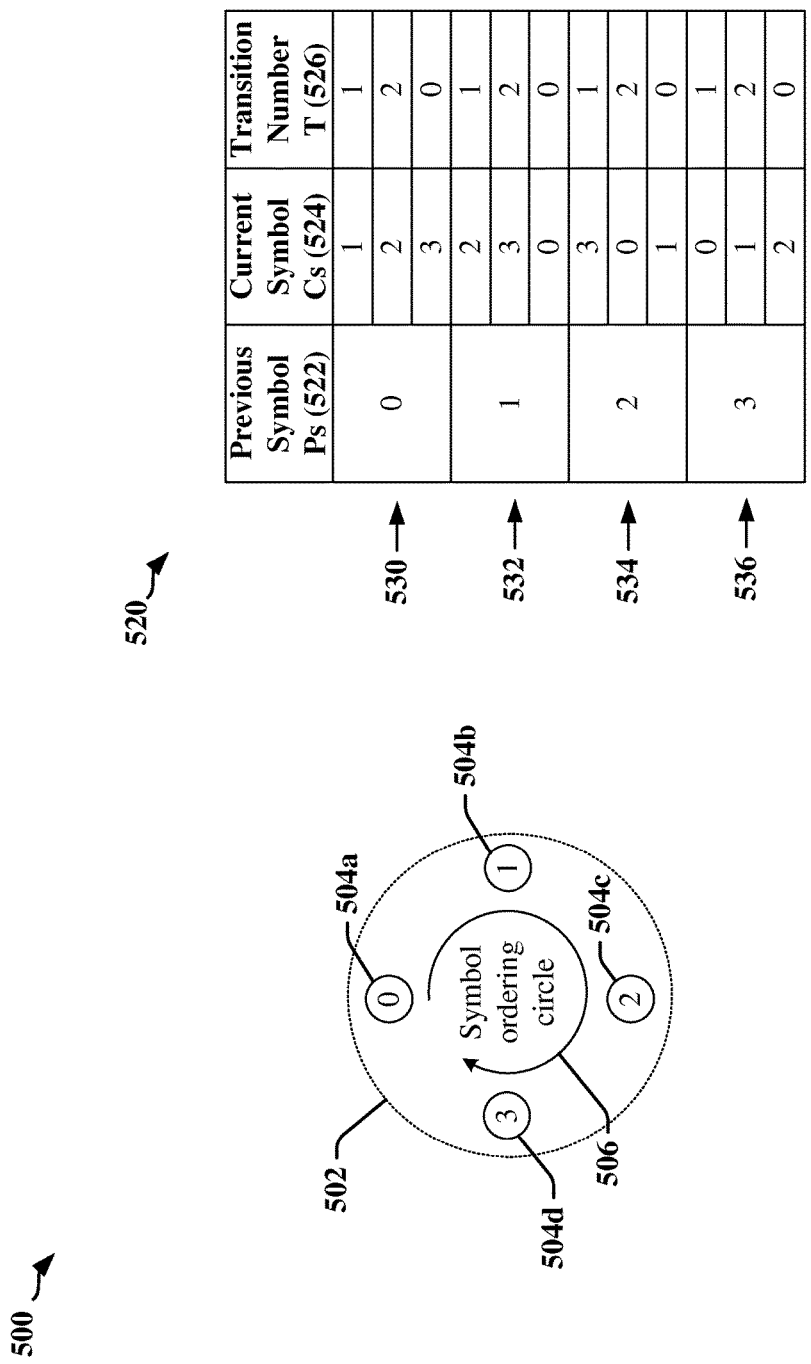
FIG. 5 illustrates an encoding scheme that may be used to control conversions between transition numbers and sequential symbols.

FIG. 5 is a drawing illustrating a simple example of an encoding scheme 500. In this example, the encoding scheme may be used by the encoder 406 configured to produce a sequence of symbols 416 for transmission on a two-wire CCIe interface. The encoding scheme 500 is also used by a transcoder 424 to extract data from symbols received from signals transmitted on the signal wires 418 of the interface. In the illustrated encoding scheme 500, the use of two signal wires 418 permits definition of 4 basic symbols S: {0, 1, 2, 3}. Any two consecutive symbols in the sequence of symbols 416, 434 have different states, and the symbol sequences 0,0, 1,1, 2,2 and 3,3 are invalid combinations of consecutive symbols. Accordingly, only 3 valid symbol transitions are available at each symbol boundary, where the symbol boundary is determined by the transmit clock and represents the point at which a first symbol (Ps) terminates and a second symbol (Cs) begins. The first symbol may be referred to as the preceding or previous symbol 522 terminates and the second symbol may be referred to as the current symbol 524.

According to certain aspects disclosed herein, the three available transitions are assigned a transition number (T) 526 for each previous symbol 522. The value of T 526 can be represented by a ternary number. In one example, the value of transition number 526 is determined by assigning a symbol-ordering circle 502 for the encoding scheme. The symbol-ordering circle 502 allocates locations 504a-504d on the symbol-ordering circle 502 for the four possible symbols, and a direction of rotation 506 between the locations 504a-504d. In the depicted example, the direction of rotation 506 is clockwise. The transition number 526 may represent the separation between the valid current symbols 524 and the immediately preceding previous symbol 522. Separation may be defined as the number of steps along the direction of rotation 506 on the symbol-ordering circle 502 required to reach the current symbol 524 from the previous symbol 522. The number of steps can be expressed as a single digit base-3 number. It will be appreciated that a three-step difference between symbols can be represented as a $0_{base-3}$. The table 520 in FIG. 5 summarizes an encoding scheme employing this approach.

At the transmitter 400, the table 520 may be used to lookup a current symbol 524 to be transmitted, given knowledge of the previous symbol 522 and an input ternary number, which is used as a transition number 526. At the receiver 420, the table 520 may be used as a lookup to determine a transition number 526 that represents the transition between the previous symbol 522 and the current symbol 524. The transition number 526 may be output as a ternary number.

The use of a transcoder that embeds clock information in a sequence of symbols can disassociate data 402 received for transmission by a transmitter 400 from the sequence of symbols 416 transmitted on signal wires 418. Consequently, a received raw symbol 436 cannot be directly decoded to obtain the data 402 provided to the transmitter 400 without consideration of at least one previously transmitted symbol. This disassociation can render conventional error correction techniques ineffective. For example, a conventional system may append an error correction code (ECC) to data 402, where the ECC may be a cyclic redundancy code (CRC) calculated from a predefined block size of data 402 or a packet length. The ECC may be used to identify and/or correct occurrences of errors during transmission in a conventional interface, where the errors may include one or more bit errors.

In an interface that uses transition encoding, symbol errors manifest in bursts of bit errors at the receiver. That is, multiple bit errors can be caused by a single symbol transmission error. In these circumstances, a CRC often exceeds Hamming distance and is not a practical solution for error detection.

Figure 6:
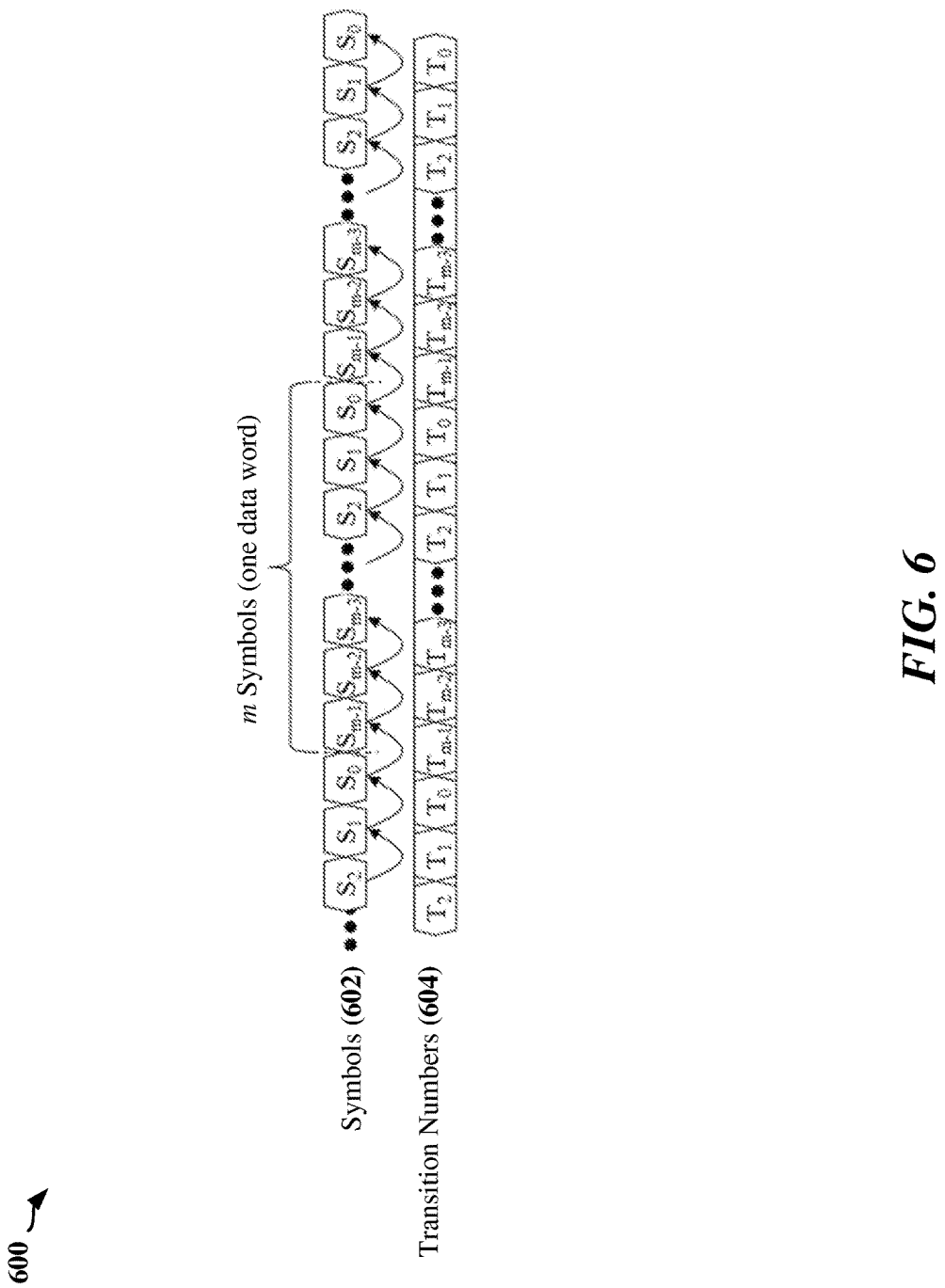
FIG. 6 illustrates the relationship between symbols and transition numbers in one example of a transition-encoding interface.

FIG. 6 is a timing diagram 600 that illustrates the relationship between symbols 602 and transition numbers 604, which may also be referred to herein as "transition symbols." In this example, each data word is encoded in m symbols transmitted on the multi-wire interface. A word transmitted in m symbols may be decoded using the formula:

$$\sum_{k=0}^{m-1} T_k r^k$$

where $T_k$ is the transition number at the $k^{th}$ iteration, and r is number of available symbols at each transition between symbols. For example, in a 3! interface where a self-transition is prohibited (to ensure that a receive clock can be reliably generated), r=5 states of the 6 defined states are available at each symbol transition. In various examples, the 3! interface may encode data in sequences of m=4 symbols or m=7 symbols. In a 4! interface, r=23 states of the 24 defined states are available at each symbol transition, and, the 4! interface may encode data in sequences of m=2 symbols. In a CCIe interface, r=3 states of the 4 defined states are available at each symbol and data words may be encoded in sequences of m=12 symbols. For a 3-wire single-ended interface, values of m=12 and r=7 may be used. For a 4-wire single-ended interface, values of m=10 and r=15 may be used.

Figure 7:
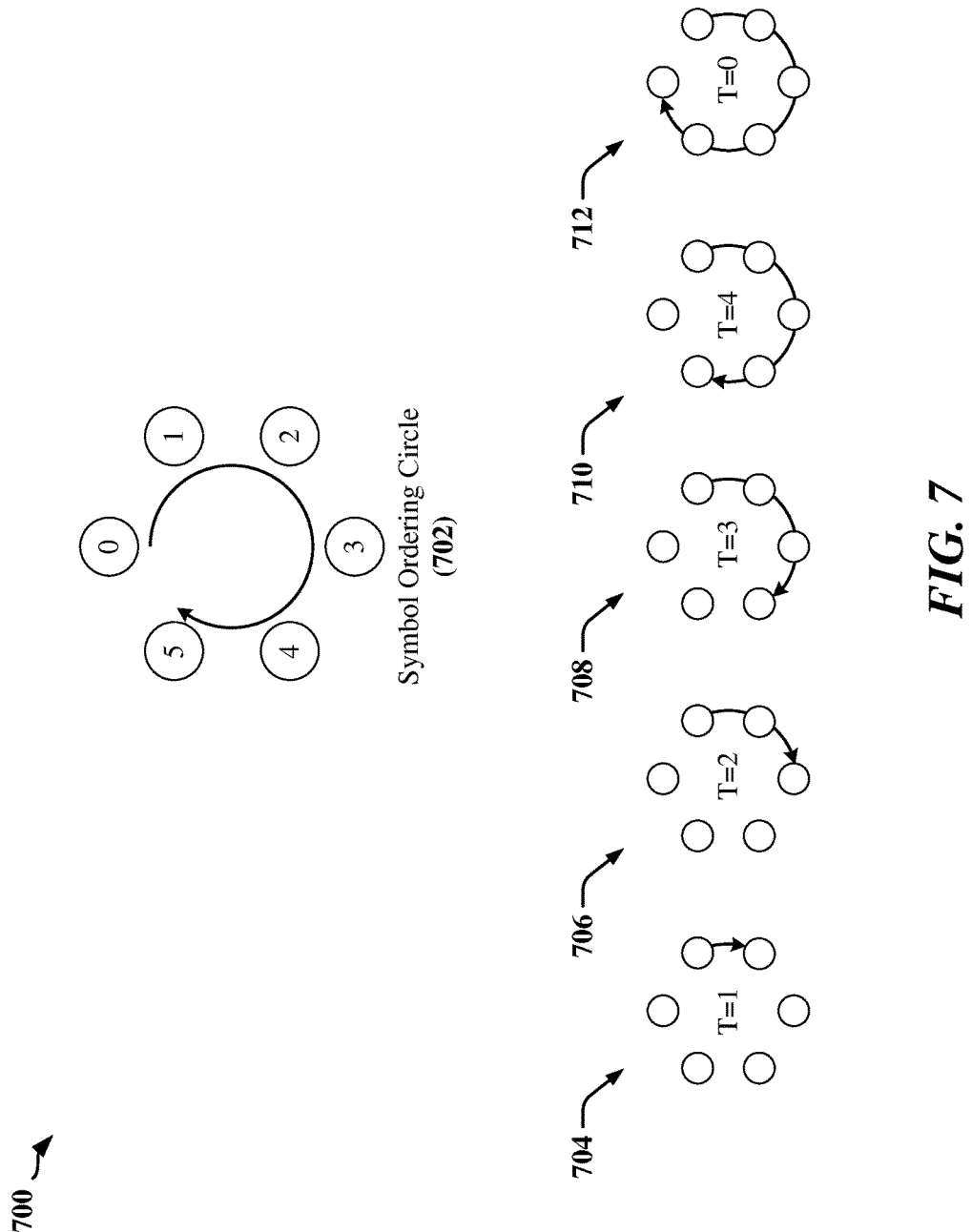
FIG. 7 illustrates possible transition number-to-symbol encoding at a symbol boundary in a 3! interface.

FIG. 7 is a drawing 700 that illustrates transition number-to-symbol encoding for a 3! interface. In this example, there are 6 possible symbols, S: {0, 1, 2, 3, 4, 5}, arranged around the symbol-ordering circle 702. Clock information is embedded in sequences of symbols by ensuring that the same symbol does not appear in any two consecutive symbol intervals. In this example, =5, and a transition number (T) may be assigned a different value for each type of transition 704, 706, 708, 710, 712. The value of the transition number may indicate the location of a next symbol on the symbol-ordering circle 702 relative to the position of a current symbol on the symbol-ordering circle 702. The transition number may take a value in the range 1-5. Since the current symbol cannot be the same as the previous symbol, the number of steps between the current and next symbols cannot be zero.

A transition number may be assigned in accordance with the formula:

T=Ps+1≤Cs?Cs−(Ps+1):Cs−(Ps+1)+6

Conversely, the current sequential symbol number (Cs) may be assigned according to:

Cs=Ps+1+T<6?Ps+1+T:Ps+1+T−6 where Cs is the current symbol, and Ps is the previously received symbol.

Figure 8:
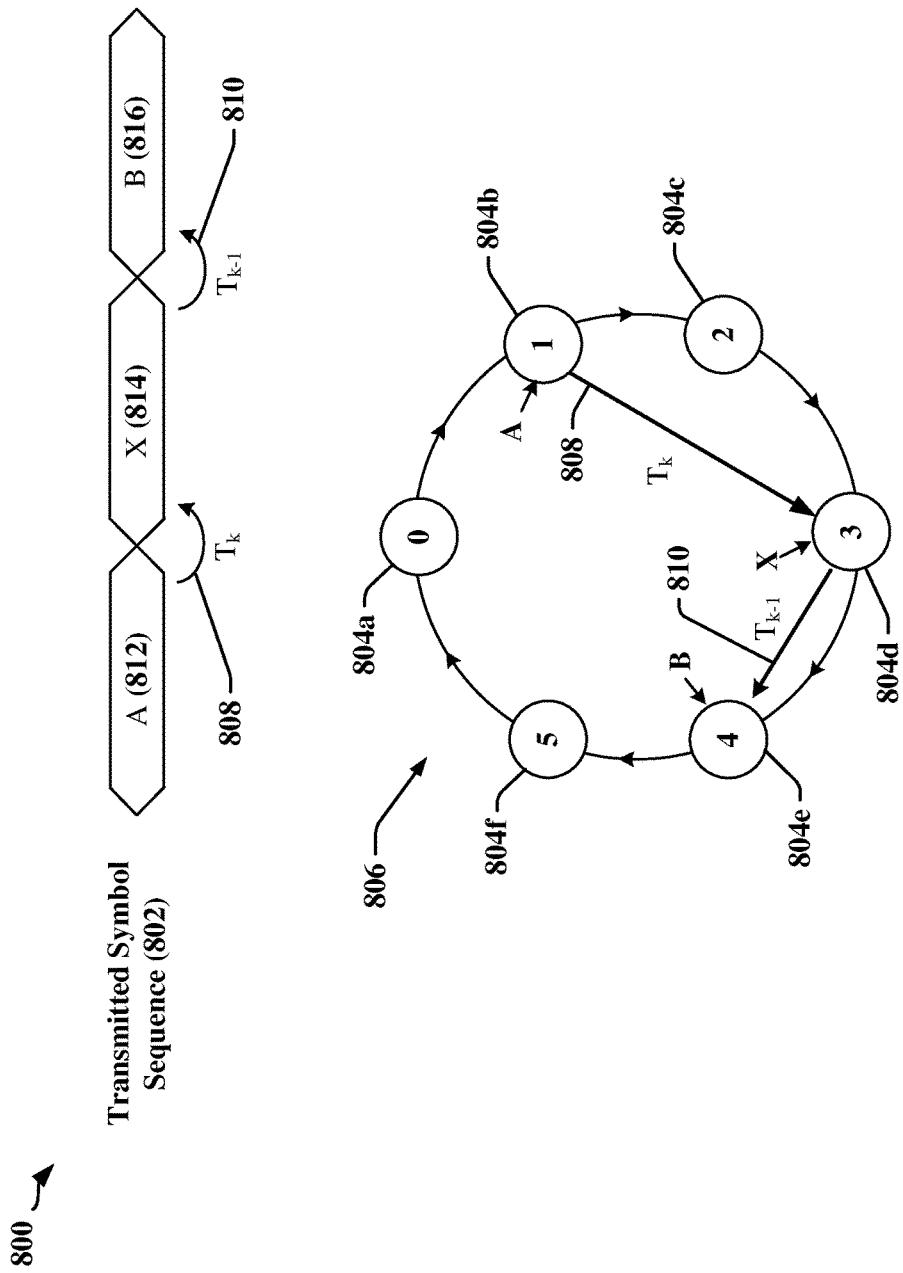
FIG. 8 illustrates a mathematical relationship between transition numbers and symbols in a 3! interface.

FIG. 8 is a diagram that illustrates a generalized example 800 of symbol transition clocking transcoding. In this example 800, an interface provides six possible signaling states per symbol transmitted on a multi-wire communication interface, with clock information embedded at each transition between consecutive symbols by ensuring that each pair of consecutively transmitted symbols includes two different symbols. Accordingly, 5 states are available at each transition between symbols. A data word is encoded by converting the bits of the data word to a transition number, which selects the next symbol to be transmitted based on the symbol being currently transmitted. In the example 800, three sequential symbols 812, 814, 816 are transmitted over the multi-wire communication interface, where each symbol 812, 814, 816 defines one of the six signaling states of the multi-wire communication interface. Data and clock information are encoded in the transitions between consecutive pairs of the symbols 812, 814, 816. The transitions may be represented as digits of transition numbers 808, 810. Each digit of the transition number identifies a transition between a pair of consecutive symbols in the sequence of symbols, and in this context, the digits may also be referred to as transition numbers. As noted herein, for a sequence of m symbols data is encoded as:

$$data = \sum_{k=0}^{m-1} T_k r^k$$

where k has a value between 0 and m−1. A first transition number ($T_k$) 808 corresponds to the transition between a first symbol 812 (A) and a second symbol 814 (X), and a second transition number ($T_{k-1}$) 810 corresponds to the transition between the second symbol 814 (X) and a third symbol 816 (B). Here, the first symbol 812 may encode the most significant bits of a data word.

In one example, a multi-bit data word may be converted to a sequence of m transition numbers. Each transition number may be expressed using a ternary number, quaternary number, quinary number, senary number, or using some other numeral system that can represent r transitions. That is, the numeral system may be a base r system providing numbers that can span the range 0 to r−1. Each transition number may select a next symbol for transmission based on the current symbol being transmitted. The next symbol is selected from symbols that are different from the current symbol in order to ensure a signaling state transition occurs in order to embed clock information in the sequence of symbols 802. That is, the transmission of two different symbols in a consecutive pair of symbols results in a change in signaling state of at least one wire of a multi-wire interface, and a receiver can generate a receive clock based on the changes detected in signaling state between consecutive symbols.

The symbol-ordering circle 806 illustrates one method of selecting a next symbol in the example 800. Here, the transition number may be expressed as a quinary number (base-5), with possible values {0, 1, 2, 3, 4}. For each of six possible symbols 804a-804f, one of six signaling states is transmitted on the multi-wire communication interface. The six symbols 804a-804f are arranged in different positions around the symbol-ordering circle 806. Given a current symbol location on the symbol-ordering circle 806 a transition number T may be encoded by selecting, as a next symbol, the symbol located T clockwise steps on the symbol-ordering circle 806. In one example, when the current symbol is Symbol-0 804a, a transition number value of T=1 selects Symbol-1 804b as the next symbol, a transition number value of T=2 selects Symbol-2 804c as the next symbol, a transition number value of T=3 selects Symbol-3 804c as the next symbol, and a transition number value of T=4 selects Symbol-4 804d as the next symbol. A transition number value of T=0 may cause a rollover in that the transition number selects the symbol 5 clockwise steps (or 1 counterclockwise steps) from the current symbol (Symbol-0 804a), thereby selecting Symbol-5 804f as the next symbol.

In the example of the transmitted sequence of symbols 802, the first symbol 812 in the sequence of symbols 802 may correspond to Symbol-1 804b. Input data may be processed to produce the first transition number 808 with a value of $T_k=2$, and the second transition number 810 with a value of $T_{k-1}=1$. The second symbol 814 may be determined to be Symbol-3 804d based on the value of $T_A$ and the third symbol 816 may be determined to be Symbol-4 804e based on the value of $T_{k-1}$.

At a receiver, the symbol-ordering circle 806 may be used to determine a transition number for each transition between consecutive symbols 812, 814, and/or 816. In one example, the receiver extracts a receive clock based on the occurrence of changes in signaling state between consecutive symbols 812, 814, and/or 816. The receiver may then capture the symbols 812, 814, 816 from the multi-wire interface and determine a transition number representing the transition between each pair of consecutive symbols 812, 814, and/or 816. In one example, the transition number may be determined by calculating the number of steps on the symbol-ordering circle 806 between the pair of consecutive symbols 812, 814.

Error Detection in a Transition Encoding Interface

According to certain aspects disclosed herein, reliable error detection may be implemented in a transition-encoded interface using an EDC added to data to be transmitted over the transition-encoded interface. The EDC may include a predefined number of bits with a predefined number of bits, where the EDC has a known, fixed value. In one example, the EDC has a zero value when transmitted. In some instances, the EDC is provided as the least significant bits (LSBs) of each word to be transmitted on the interface. The form and structure of the EDC word may be selected such that a single signaling state error affecting a word causes the EDC decoded at the receiver to have a value that is different from the fixed value (e.g., a non-zero value).

Figure 9:
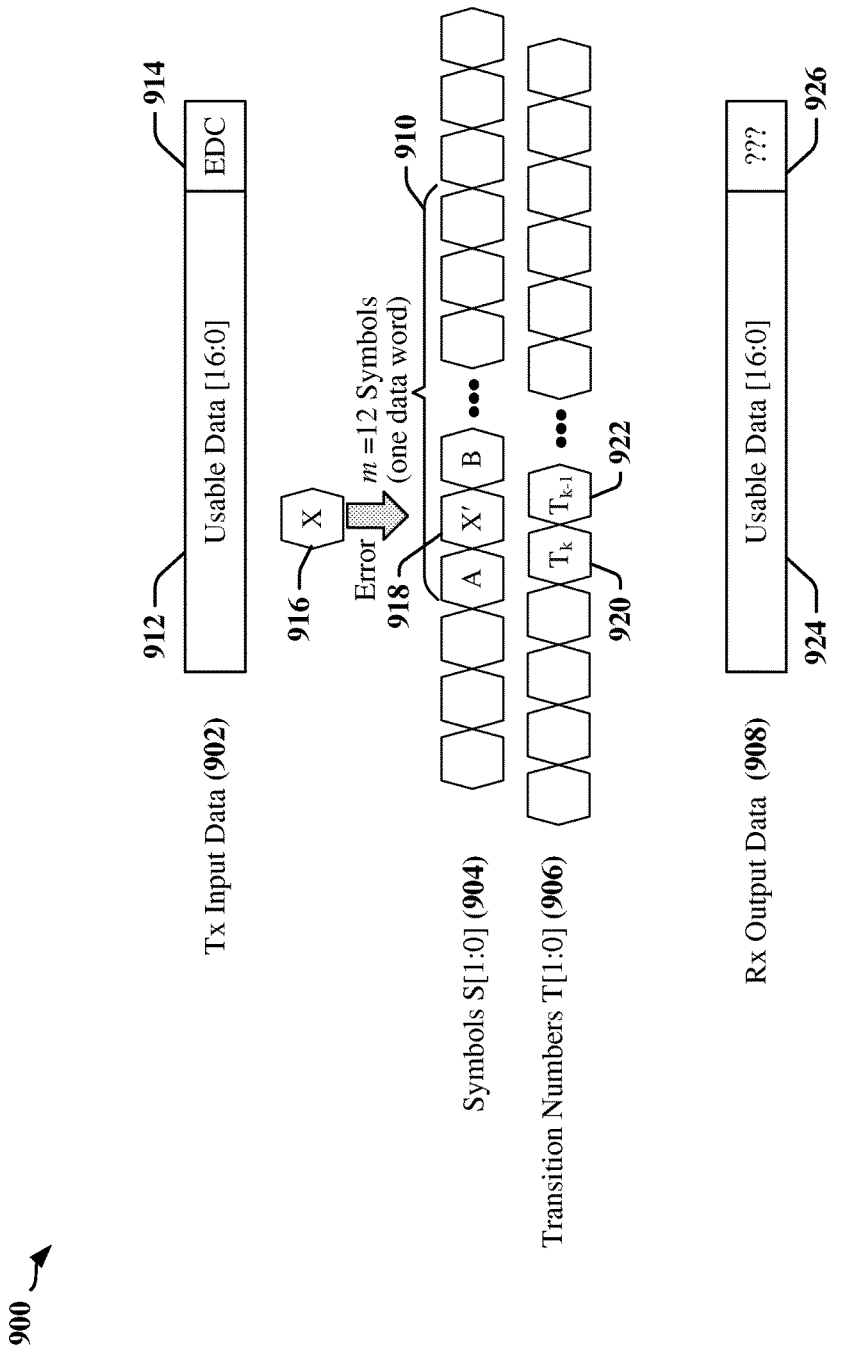
FIG. 9 illustrates an example in which a sequence of symbols transmitted over a multi-wire communication interface is affected by a single symbol error.

FIG. 9 illustrates an example 900 of the effect of a single error affecting a transition-encoded interface. In the example, a data word 912 is provided for transmission over the interface. An EDC 914 is appended to the data word 912 to produce a transmission word 902 that is input to and encoder. The transmission word 902 is transmitted in a sequence of symbols 910, where the sequence of symbols 910 includes 12 symbols. The sequence of symbols 910 is transmitted over a two-wire interface configured for CCIe operation and received at a receiver in a stream of symbols 904. In transmission, a signaling error occurs such that an originally-transmitted symbol 916 is modified and received as an erroneous symbol 918. A stream of transition numbers 906 corresponding to the received stream of symbols 904 includes transition numbers 920, 922 that include error offsets. A first transition number 920 represents the difference between the preceding symbol and the erroneous symbol 918, and a second transition number 922 represents the difference between the erroneous symbol 918 and the next symbol transmitted after the affected symbol.

The size, location, and structure of the EDC 914 may be selected such that the occurrence of a single symbol error produces an EDC 926 at the receiver that is different than the transmitted EDC 914. In one example, the EDC 914 includes multiple bits and may be set to a zero value. In the example of a CCIe interface, the EDC 914 may have three bits.

Figure 10:
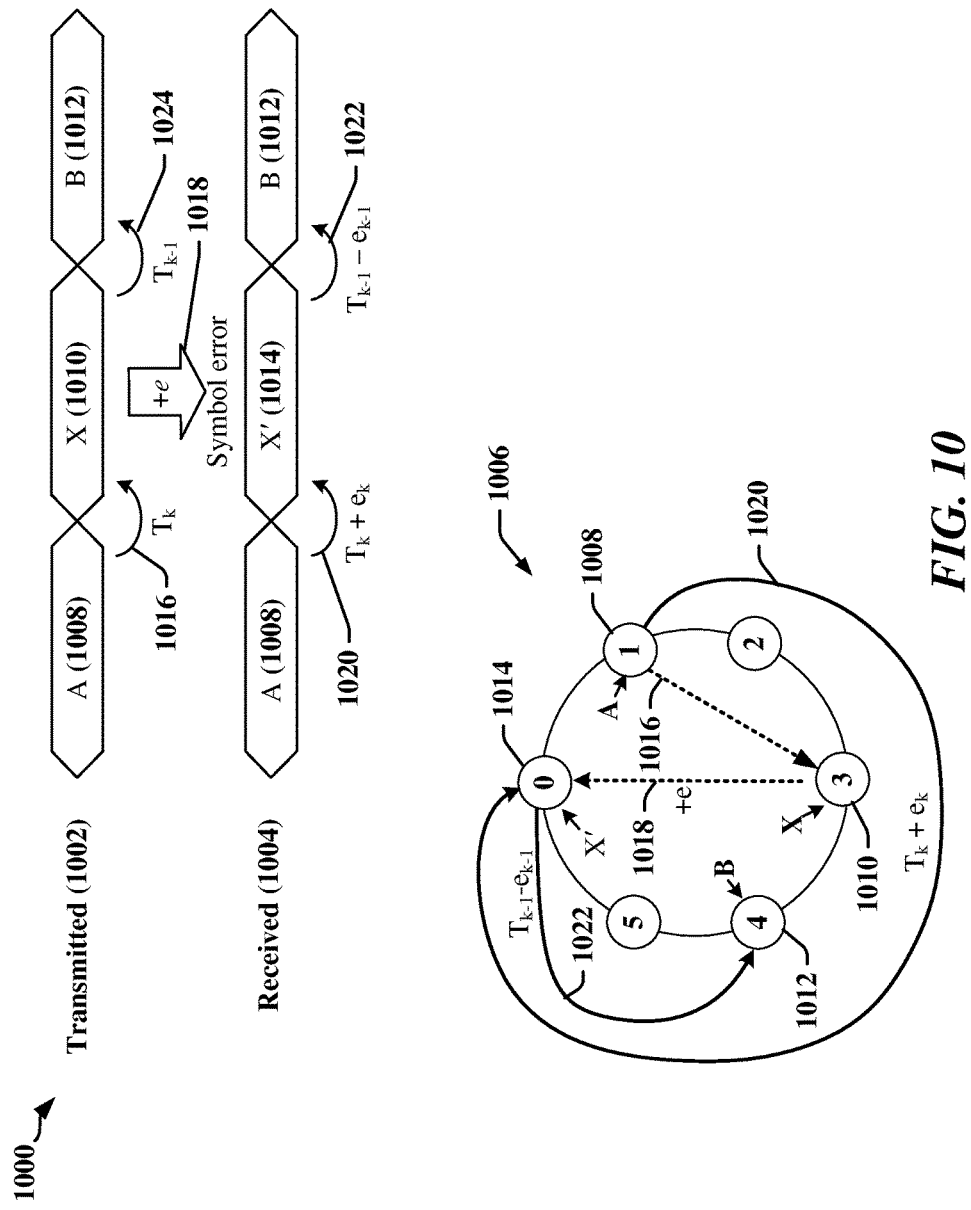
FIG. 10 is a diagram that illustrates a mathematical relationship characterizing a single symbol error in a sequence of symbols transmitted over a multi-wire communication interface.

FIG. 10 is a diagram that illustrates an example in which a sequence of symbols 1002 transmitted over a multi-wire communication interface is affected by a single symbol error 1018 resulting in the capture of an erroneous symbol 1014 in the received sequence of symbols 1004. The transmitted sequence of symbols 1002 includes a first symbol 1008 (the A symbol), a second symbol (the X symbol 1010) and a third symbol 1012 (the B symbol). In the received sequence of symbols 1004, the first symbol 1008 and the third symbol 1012 are correctly received, while the second symbol 1014 is modified by the symbol error 1018 (displacement e) and is received as an erroneous symbol (the X' symbol 1014).

The occurrences of a single symbol error 1018 results in two transition number errors. The first incorrect transition number 1020 represents the transition between the correctly received first symbol 1008 and the X' Symbol 1014. The second incorrect transition number 1022 represents the transition between the X' Symbol 1014 and the correctly received third symbol 1012. The first incorrect transition number 1020 may be expressed as $T_k+e_k$, where $T_k$ is the first correct transition number 1016 corresponding to a transition between the first symbol 1008 and the X Symbol 1010, and $e_k$ is the value of the error created in the first incorrect transition number 1020 relative to the first correct transition number 1016. The second incorrect transition number 1022 may be expressed as $T_{k-1}+e_{k-1}$, where $T_{k-1}$ is the second correct transition number 1024 corresponding to the transition between the X Symbol 1010 and the third symbol 1012, and $e_{k-1}$ is the value of the error created in the second incorrect transition number 1022 relative to the first correct transition number 1024.

The effect of the single symbol error 1018 is illustrated in the decoding transition circle 1006. The first symbol 1008, which corresponds to Symbol-1, is initially received from the multi-wire interface. The next symbol is incorrectly captured as the X' Symbol 1014 due to error. The X' Symbol 1014 may correspond to Symbol-0. The third symbol 1012, which corresponds to Symbol-4, is then received from the multi-wire interface. In this example, the most significant symbol is transmitted first, and:

$$e=3, T_k=2, T_{k-1}=1$$

$$T_k+e=2+3=5=0_{base5}, \text{ and } e_k=-2$$

$$T_{k-1}-e=1-3=-2=4_{base5}, \text{ and } e_{k-1}=-3$$

Each data word may be represented by a sequence of transition numbers: $\{T_0, T_1, \ldots, T_{m-1}\}$.

The displacement error e represents the difference between the transmitted X symbol 1010 and the received X' Symbol 1014, which may correspond to a number of steps in the decoding transition circle 1006. The value of e is not necessarily equal in value to $e_k$ due to roll over in the number system used to express transition numbers. For example, a transition number with a value of 3 may represent the difference between the transmitted X symbol 1014 and the received X' Symbol 1014 the first correct transition number 1016 on the decoding transition circle 1006 caused by the displacement error e, while the value of $e_k$ has a value of −2.

For two consecutive symbol transitions:

$$\text{Bits} = T_k r^k + T_{k-1} r^{k-1}$$

The result of a single error affecting two consecutive symbols may be expressed as:

$$\text{Bits}' = (T_k + e_k) r^k + (T_{k-1} - e_{k-1}) r^{k-1} = (T_k r^k + T_{k-1} r^{k-1}) + (e_k r - e_{k-1}) r^{k-1}$$

where:
- $(e_k r - e_{k-1}) r^{k-1}$ may be referred to as the error effect,
- $(e_k r - e_{k-1})$ may be referred to as the error coefficient, and
- $r^{k-1}$ may be referred to as the base power.

According to certain aspects, a transition-encoded interface may be configured such that r is an odd number. When r is an odd number, it follows that $r^{k-1}$ is also an odd number (LSB is non-zero). Accordingly, the value of $(e_k r - e_{k-1})$ determines the number of LSBs required for an EDC. FIG. 11 provides a listing of $r^n$ (where n lies in the range 0 to 15) when r=3 and 5. The first table 1100 may relate to a CCIe interface, where r=3 transitions are available at each symbol interval. In each instance, the LSB 1104 of the base power is set to '1.' The second example 1102 may relate to a 3-wire 3! interface, where r=5 transitions are available at each symbol interval (6 possible symbols). In each instance, the LSB 1206 of the base power is set to '1.'

FIG. 12 is a table 1200 that tabulates error coefficients and illustrates error coefficient when a symbol error does not involve repetition of a symbol in consecutive symbol intervals, which would cause a clock miss. $|e_k|$ is always smaller than r. That is:

$$1 \leq |e_k| \leq r-1,$$

$$1 \leq |e_{k-1}| \leq r-1.$$

Since the least value of $|e_k|$ is 1, the least value for $|e_k r|$ is r. The largest value of $|e_{k-1}|$ is r−1. The error coefficient $(e_k r - e_{k-1})$ is never zero when a single symbol error is present.

FIG. 13 illustrates an example 1300 of calculation and tabulation of the longest non-zero LSB portion in an error coefficient. Here, the power of 2 LSBs of $(e_k r - e_{k-1})$ is the longest when both $|e_k|$ and $e_{k-1}|$ are longest power of 2 ($2^n$), and $e_k = e_{k-1}$. The Longest power of 2 LSBs of error coefficient determines the size of the "error detection constant LSBs."

FIG. 14 illustrates two examples 1400, 1420 of cases in which a single symbol error results in an error in a single transition number 1408, 1426. In the first example 1400, a signaling error affects the last transmitted symbol 1402 in a preceding sequence of symbols. The signaling error causes a receiver to detect a modified symbol 1404 as the last-received symbol in the preceding sequence of symbols. The error may introduce an offset in the transition number 1406 that represents the difference between the last transmitted symbol 1402 in a preceding sequence of symbols and the first symbol of a current sequence of symbols. In the first example 1400, the effect of the error may be expressed as: $e_{m-1} r^{m-1}$, where the error coefficient is $e_{m-1}$ and the base power is $r_{m-1}$.

In the second example 1420, a signaling error affects the last transmitted symbol 1422 in a current sequence of symbols. The signaling error causes a receiver to detect a modified symbol 1424 as the last-received symbol in the current sequence of symbols. The error may introduce an offset in the transition number 1426 that represents the difference between the last transmitted symbol 1422 in the current sequence of symbols and the first symbol of a next sequence of symbols. In the first example 1400, the effect of the error may be expressed as $e_0$.

Table 1 lists the number of LSBs in an EDC that can detect a single symbol error in a multi-wire interface that uses transition encoding.

TABLE 1

| r | EDC length (bits) | Example |
|---|---|---|
| 3 | 3 | 2-wire single-ended (e.g. CCIe) |
| 5 | 5 | 3-wire multi-level differential (3!) |
| 7 | 6 | 3-wire single ended |
| 9 | 7 | |
| 11 | 5 | |
| 13 | 6 | |
| 15 | 8 | 4-wire single-ended |
| 17 | 9 | |
| 19 | 8 | |
| 21 | 7 | |
| 23 | 6 | 4-wire multi-level differential (4!) |

The cases illustrated in FIG. 14 do not affect the maximum number of LSBs required in an EDC to permit detection of a single symbol error.

Detection of Multiple Symbol Errors Per Word

FIG. 15 is a timing diagram 1500 that illustrates a first example of signaling errors that affect two symbols 1504, 1506 in a sequence of symbols 1502 that encodes a single data word. FIG. 15 relates to an example in which signaling errors affect two non-consecutive symbols. The errors in symbols 1504, 1506 result in corresponding pairs of transition errors 1508, 1510. These transition errors result in erroneous transition numbers 1512, 1514, 1516, 1518. The error effect attributable to the first affected symbol 1504 may be stated as $(e_k r - e_{k-1}) r^{k-1}$, while the error effect attributable to the first affected symbol 1504 may be stated as $(e_j r - e_{j-1}) r^{j-1}$. Multiple symbol errors can be detected provided if the total effect of the error $$(e_j r - e_{k-1})^{k-1} + (e_k r - e_{k-1})^{k-1}$$

always modifies an EDC that has a predetermined length and value.

FIG. 16 is a timing diagram 1600 that illustrates a second example of signaling errors that affect two consecutive symbols 1604, 1606 in a sequence of symbols 1602 that encodes a single word. The errors in the consecutive symbols 1604, 1606 result in transition errors 1608 that cause the generation of three erroneous transition numbers 1610, 1612, 1614. The error effect attributable to the affected symbols 1504, 1506 may be stated as $(e_k r^2 + e_{k-1} r + e_{k-1}) r^{k-2}$. The error effect attributable to errors affecting consecutive symbols 1604, 1606 can be detected with a shorter EDC than errors in non-consecutive symbols 1504, 1506 in receivers adapted in accordance with certain aspects disclosed herein.

FIG. 17 is a table 1700 that illustrates the number of bits of an EDC used for various values of r (available transitions per symbol boundary) and m (number of symbols used to encode a data element). The size of an EDC used for detecting two symbol errors varies with the value of m. The first row (shaded) of the table 1700 corresponds to an EDC used to detect a single symbol error.

According to certain aspects disclosed herein, a receiver can be configured to detect two symbol errors in a sequence of symbols representing a data word, when an EDC of sufficient length is transmitted with the data word. The length of the EDC may be determined based on the number of symbols used to encode a data word and the number of transitions available at the boundary between a pair of consecutively transmitted symbols.

Symbol slip error caused by clock miss or extra clock may not be detected by an error detection constant. However, the majority of these types of errors can be detected by higher protocol layers, at the next word, and/or using a state machine at the receiver device.

Correction of a Single Symbol Error Per Word

FIG. 18 is a diagram 1800 illustrating the operation of certain circuits that can be used to correct a single symbol error per word in accordance with certain aspects disclosed herein. An error correction circuit may correct a single symbol error in a sequence of symbols 1802 that encodes a word, when an EDC transmitted in the sequence of symbols 1802 enables detection of two symbol errors in the sequence of symbols 1802. The error correction circuit may be configured to generate and decode different permutations of the symbols in a sequence of symbols 1802 received from a communication link after an error has been detected in the sequence of symbols 1802. Each permutation may include a modification to one symbol in the sequence of symbols 1802. When a single symbol error is introduced during transmission, changing a correctly received symbol in the sequence of symbols 1802 causes a decoder to decode an EDC that indicates presence of one or more errors in the sequence of symbols 1802. Changing a symbol in the sequence of symbols 1802 that has an error to another incorrect symbol results in an EDC that indicates that the single error remains in the sequence of symbols 1802. When a modified symbol in a permutation of the symbols reverses the error introduced during transmission, the decoder decodes an EDC that matches the expected, originally transmitted EDC value and the permutation of the symbols and/or data decoded from the permutation of the symbols may be used by the receiver in place of the received sequence of symbols 1802 and/or data decoded therefrom.

In the context of FIG. 18, a transmitter may have encoded a combined data word and an EDC in m symbols. In the example illustrated in FIG. 9, a transmission word 902 may include a data word 912 and an EDC 914. A receiver may determine that at least one symbol has been affected by a transmission error if, after decoding the m symbols in the sequence of symbols 1802, the decoded EDC has an unexpected value. The received EDC may have an unexpected value when it does not match a predefined value of the EDC 914 used for transmissions over the communication link and appended to the data word 912 by the transmitter. In one example, the transmitter may append a number of zero-value bits as the least significant bits of the transmission word 902, and a non-zero decoded EDC may indicate that at least one symbol error has occurred in transmission the sequence of symbols 1802.

An error correction circuit may correct a single symbol error when the EDC can be used to detect the occurrence of two symbol errors in one sequence of symbols 1802. In one example, an EDC appended as a sufficient number of least significant bits to a data word may permit two symbol errors to be detected, and a single symbol error to be corrected by an error correction circuit.

The error correction circuit may be enabled when an unexpected EDC value is decoded from the sequence of symbols 1802. The error correction circuit may correct a single symbol error by decoding each permutation of symbols obtained by modifying a single symbol in the sequence of symbols 1802. A permutation of symbols that produces a decoded EDC with the expected EDC value may be considered to have corrected the transmission error. That is, the permutation of symbols includes a symbol that has been modified in a manner that reverses the prior modification caused by the transmission error.

In the example illustrated in the diagram 1800 of FIG. 18, each symbol in the sequence of symbols 1802 can take one of a plurality of r+1 possible signaling states, where r represents the number of possible transitions per symbol. That is, in an encoding scheme that embeds clock information, each consecutively transmitted pair of symbols include two different symbols to ensure a transition occurs at each symbol boundary, and one of the r+1 defined symbols is not available at each symbol boundary. In a first example, a two-wire interface may be operated such that r+1=4 signaling states are available. In a second example, a three-wire 3! interface may be operated such that r+1=6 signaling states are available. A transmission error may produce a symbol $S_i$ that is assigned a value $V_{err}$ by a receiver that is different from the value $V_{correct}$ that would have been assigned to the originally transmitted symbol. A decoder may produce a received EDC that does not have an expected value after decoding the sequence of symbols 1802 that includes a symbol affected by error (i.e., $S_i=V_{err}$). The expected EDC value 1818 may have a predefined EDC value.

According to certain aspects, the value of $S_i$ may be iteratively changed and provided in a permutation of the sequence of symbols 1802 that is then decoded to determine if the permutation of symbols produces an EDC that matches the expected EDC value 1818. When the symbol affected by error is replaced in a permutation of symbols with the originally transmitted symbol value (i.e., $S_i=V_{correct}$), the decoded EDC has the expected EDC value 1818, and the permutation of symbols may be substituted for the received sequence of symbols 1802, and/or a data word decoded from the permutation of symbols may be substituted for the data word decoded from the received sequence of symbols 1802.

In some implementations, the values of all symbols 1812 in the sequence of symbols 1802 may be provided to a set of decoders 1808 that includes r (i.e., (r+1)−1) symbols-to-data decoders. Each decoder in the set of decoders 1808 receives the value of each symbol in the sequence of symbols 1802, except for the value of $S_i$. In place of the value of $S_i$, each decoder in the set of decoders 1808 receives a modified version of $S_i$, and accordingly each decoder in the set of decoders 1808 decodes a permutation of symbols derived from the sequence of symbols 1802. A set of adders 1806 may be configured to provide different versions of $S_i$ to the set of decoders 1808. The set of adders 1806 may include modulo (r) adders that each provide a different symbol value to substitute for $S_1$ in a permutation of symbols.

In the example depicted in FIG. 18, all permutations involving changes to a single symbol can be processed and decoded in parallel. The EDC values 1816 decoded from multiple permutations of symbols can be compared using multi-bit comparators 1810, each of which may produce a logic 1 if a match exists between the expected EDC value 1818 and the EDC value 1816 decoded from a corresponding permutation of symbols. If one of the multi-bit comparators 1810 indicates a match, then the transmission error affecting the sequence of symbols 1802 may be determined to have been corrected.

In some implementations, an error correction block may be provided for each symbol in the sequence of symbols 1802, and sets of permutations may be generated and decoded concurrently for each symbol, where each set of permutations includes modifications of a single symbol in the sequence of symbols 1802. Each error correction block may include a set of adders 1806, a set of decoders 1808, and multi-bit comparators 1810. In these implementations, error correction is accomplished when an error correction block provides a match signal from one of the comparators 1810 in the error correction block, and the permutation of symbols and/or corresponding data word may be provided as outputs of the error-correction circuit.

In other implementations, an error correction circuit may use a state machine, sequencing logic and/or one or more processing circuits to perform error correction in multiple iterations. In some of these implementations, up to m error correction cycles may be executed to test the effect of permutations to each symbol ($S_0$, $S_1$, ... $S_i$, ... $S_m$) in turn. In a first error correction cycle, the r permutations related to the first symbol ($S_0$) in the sequence of symbols 1802 are decoded to determine if an expected EDC value can be decoded. In the second error correction cycle, the r permutations related to the first symbol ($S_1$) in the sequence of symbols 1802 are decoded to determine if an expected EDC value can be decoded. This process may continue until a permutation is discovered that matches the expected EDC value 1818 when decoded. The error correction process may terminate when an EDC match is obtained.

Examples of Error Correction Techniques According to Certain Aspects

The hardware used to implement an error correction circuit may be reduced by sharing the components used to generate and decode permutations of symbols. For example, the set of adders 1806 may be replaced with a modulo (r) counter that is preloaded with the value of $S_i$ in the received sequence of symbols 1802. For each of r iterations, the counter may be incremented and its output may be provided to a decoder as a substitute for the value of $S_i$ in the received sequence of symbols 1802. The EDC produced by the decoder may be compared with the expected EDC value 1818. In some examples, a counter and decoder may be provided for each symbol in the sequence of symbols 1802 such that m permutations are generated and decoded in each cycle of the error detection process, which may extend to r cycles. In other examples, a single counter may be used and the maximum number of error detection cycles may be calculated as m(r−1) cycles.

Various combinations of hardware may be employed to correct errors according to certain aspects disclosed herein. In one hardware-intensive example, counters, adders and decoders may be provided such that every possible permutation of symbols may be tested concurrently. In the latter example, the error correction circuit may operate with low latency. In another example, a single encoder may be used to test every permutation sequentially, such that error correction may require significant time to complete the error correction process. According to certain aspects, a tradeoff between hardware and error correction process time may be made based on application requirements. In some instances, permutation generation, decoding, and/or error correction decisions may be implemented in a sequencer or processing device that is controlled by software instructions.

FIG. 19 is diagram 1900 that illustrates a first example of a configuration of decoders that may be used to correct symbol errors in accordance with certain aspects disclosed herein. In this example, sequencing logic, a state machine, or a controller may be used to perform error correction in a number of iterations where, in each iteration, permutations created by modifying a single symbol may be tested. In the example, a data word may be encoded in a sequence of symbols that includes 10 symbols {$S_0$, $S_1$, ... $S_9$}, and each symbol can have one of 4 values. When a symbol error has been determined to be present in a received sequence of symbols 1902, three permutations 1904, 1906, 1908 of the sequence of symbols 1902 may be concurrently generated for each of a plurality of test iterations. In each permutation 1904, 1906, 1908 generated in a test iteration, only one symbol location (the target symbol 1910) in the sequence of symbols 1902 is changed. In the example, the first iteration is in progress and only $S_0$ in the sequence of symbols 1902 is changed in the three permutations 1904, 1906, 1908. In one example, the value of $S_0$ may be modified by simple modulo 3 addition. The three permutations 1904, 1906, 1908 may then be tested using decoder circuits and/or logic 1912 that includes 3 decoders and comparators such that the EDC generated for all three permutations 1904, 1906, 1908 can be compared to the expected EDC value 1914. If correction is not accomplished, another iteration is performed for the next symbol (here, $S_1$) until all 10 symbols have been tested. This approach uses a maximum of 10 test iterations and 3 decoder paths.

FIG. 20 is diagram 2000 that illustrates a second example of a configuration of decoders that may be used to correct symbol errors in accordance with certain aspects disclosed herein. In this example, sequencing logic, a state machine, or other controller may be used to perform error correction in a number of iterations where, in each iteration, each symbol in a sequence of symbols 2002 is modified in one of a set of permutations 2004 generated per iteration. In the example, a data word may be encoded in a sequence of symbols that includes 10 symbols {$S_0$, $S_1$, ... $S_9$}, and each symbol can have one of 4 values. When a symbol error has been determined to be present in the received sequence of symbols 2002, 10 permutations 2004 of the sequence of symbols 2002 may be concurrently generated for each of a plurality of test iterations. In each of the 10 permutations 2004 generated per test iteration, a different one of the symbol locations ($S_0$, $S_1$, ... $S_9$) in the sequence of symbols 2002 is changed. In the example, the first iteration is in progress and a single symbol in each of the 10 permutations 2004 differs from the corresponding symbol in the sequence of symbols 2002 by a value of one. A symbol is changed by using modulo 3 addition to perform $S_j+1$, where $S_j$ represents the value of the corresponding symbol in the sequence of symbols 2002. The 10 permutations 2004 may then be tested using decoder circuits and/or logic 2006 that includes 10 decoders and comparators such that the EDC generated for all 10 permutations 2004 can be compared to the expected EDC value 2008. If correction is not accomplished, another iteration is performed using the next symbol value increment ($S_j+2$, then $S_j+3$) until all 3 possible values for all symbols in the sequence of symbols 2002 have been tested. This approach uses a maximum of 3 test iterations and 10 decoder paths.

FIG. 21 is a diagram 2100 that illustrates certain aspects of decoders used to correct symbol errors that may be exploited to reduce decoding overhead in accordance with certain aspects disclosed herein. The illustrated example is based on the configuration of decoders illustrated in FIG. 19, where a data word may be encoded in a sequence of symbols that includes 10 symbols {$S_0$, $S_1$, ... $S_9$} and each symbol can have one of 4 values, and where decoder circuits and/or logic 1912 include 3 decoders and comparators such that the EDC generated for all three permutations 1904, 1906, 1908 can be compared to the expected EDC value 1914. The processing overhead, and number of decoders may be reduced by considering the effect of changing a symbol in a received sequence of symbols 2102. In this example, error correction is in the fifth iteration, and $S_4$ is modified in each permutation. The 4 possible states for symbols may be represented as {A, B, C, D}, where B=A+1, C=B+1, D=C+1, and A=D+1. In the received sequence of symbols 2102, $S_3$=A, $S_4$=B. It can be seen that the third permutation 2108 changes the value of $S_4$ such that $S_4$=$S_3$=A. In transition encoding schemes, consecutively transmitted pairs of symbols cannot have the same value. In some embodiments, error correction circuits and modules may be adapted to recognize permutations 2108 that introduce an error condition when a pair of consecutive symbols 2112 are identical, and such permutations 2108 need not be tested. In some instances, permutations 2104, 2106, 2108 may be dynamically assigned to decoding paths in decoder circuits and/or logic 1912 that provide a reduced number of decoders and comparators reflecting the ability to eliminate at least one permutation 2108 due to creation of invalid pairs of consecutive symbols 2112.

The examples illustrated in FIGS. 18-21 can be scaled. For example, in FIG. 19, the decoder circuits and/or logic 1912 may be adapted to include a larger number of decoders and comparators such that sets of permutations corresponding to two or more symbols in the sequence of symbols 1902 may be concurrently tested (i.e., 6, 9, 12, etc. permutations can be tested per iteration). In another example, the decoder circuits and/or logic 2006 of FIG. 20 may be adapted to include fewer decoders and comparators such that an increased number of iterations is used to test all permutations of the sequence of symbols 1902.

Example of a Processing Circuit

FIG. 22 is a conceptual diagram 2200 illustrating a simplified example of a hardware implementation for an apparatus employing a processing circuit 2202 that may be configured to perform one or more functions disclosed herein. In accordance with various aspects of the disclosure, an element, or any portion of an element, or any combination of elements as disclosed herein may be implemented using the processing circuit 2202. The processing circuit 2202 may include one or more processors 2204 that are controlled by some combination of hardware and software modules. Examples of processors 2204 include microprocessors, microcontrollers, digital signal processors (DSPs), field programmable gate arrays (FPGAs), programmable logic devices (PLDs), state machines, sequencers, gated logic, discrete hardware circuits, and other suitable hardware configured to perform the various functionality described throughout this disclosure. The one or more processors 2204 may include specialized processors that perform specific functions, and that may be configured, augmented or controlled by one of the software modules 2216. The one or more processors 2204 may be configured through a combination of software modules 2216 loaded during initialization, and further configured by loading or unloading one or more software modules 2216 during operation.

In the illustrated example, the processing circuit 2202 may be implemented with a bus architecture, represented generally by the bus 2210. The bus 2210 may include any number of interconnecting buses and bridges depending on the specific application of the processing circuit 2202 and the overall design constraints. The bus 2210 links together various circuits including the one or more processors 2204, and storage 2206. Storage 2206 may include memory devices and mass storage devices, and may be referred to herein as computer-readable media and/or processor-readable media. The bus 2210 may also link various other circuits such as timing sources, timers, peripherals, voltage regulators, and power management circuits. A bus interface 2208 may provide an interface between the bus 2210 and one or more transceivers 2212. A transceiver 2212 may be provided for each networking technology supported by the processing circuit. In some instances, multiple networking technologies may share some or all of the circuitry or processing modules found in a transceiver 2212. Each transceiver 2212 provides a means for communicating with various other apparatus over a transmission medium. Depending upon the nature of the apparatus, a user interface 2218 (e.g., keypad, display, touch interface, speaker, microphone, joystick) may also be provided, and may be communicatively coupled to the bus 2210 directly or through the bus interface 2208.

A processor 2204 may be responsible for managing the bus 2210 and for general processing that may include the execution of software stored in a computer-readable medium that may include the storage 2206. In this respect, the processing circuit 2202, including the processor 2204, may be used to implement any of the methods, functions and techniques disclosed herein. The storage 2206 may be used for storing data that is manipulated by the processor 2204 when executing software, and the software may be configured to implement any one of the methods disclosed herein.

One or more processors 2204 in the processing circuit 2202 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 2206 or in an external computer readable medium. The external computer-readable medium and/or storage 2206 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium and/or storage 2206 may also include, by way of example, a carrier wave, a transmission line, and any other suitable medium for transmitting software and/or instructions that may be accessed and read by a computer. Computer-readable medium and/or the storage 2206 may reside in the processing circuit 2202, in the processor 2204, external to the processing circuit 2202, or be distributed across multiple entities including the processing circuit 2202. The computer-readable medium and/or storage 2206 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 2206 may maintain software maintained and/or organized in loadable code segments, modules, applications, programs, etc., which may be referred to herein as software modules 2216. Each of the software modules 2216 may include instructions and data that, when installed or loaded on the processing circuit 2202 and executed by the one or more processors 2204, contribute to a run-time image 2214 that controls the operation of the one or more processors 2204. When executed, certain instructions may cause the processing circuit 2202 to perform functions in accordance with certain methods, algorithms and processes described herein.

Some of the software modules 2216 may be loaded during initialization of the processing circuit 2202, and these software modules 2216 may configure the processing circuit 2202 to enable performance of the various functions disclosed herein. For example, some software modules 2216 may configure internal devices and/or logic circuits 2222 of the processor 2204, and may manage access to external devices such as the transceiver 2212, the bus interface 2208, the user interface 2218, timers, mathematical coprocessors, and so on. The software modules 2216 may include a control program and/or an operating system that interacts with interrupt handlers and device drivers, and that controls access to various resources provided by the processing circuit 2202. The resources may include memory, processing time, access to the transceiver 2212, the user interface 2218, and so on.

One or more processors 2204 of the processing circuit 2202 may be multifunctional, whereby some of the software modules 2216 are loaded and configured to perform different functions or different instances of the same function. The one or more processors 2204 may additionally be adapted to manage background tasks initiated in response to inputs from the user interface 2218, the transceiver 2212, and device drivers, for example. To support the performance of multiple functions, the one or more processors 2204 may be configured to provide a multitasking environment, whereby each of a plurality of functions is implemented as a set of tasks serviced by the one or more processors 2204 as needed or desired. In one example, the multitasking environment may be implemented using a timesharing program 2220 that passes control of a processor 2204 between different tasks, whereby each task returns control of the one or more processors 2204 to the timesharing program 2220 upon completion of any outstanding operations and/or in response to an input such as an interrupt. When a task has control of the one or more processors 2204, the processing circuit is effectively specialized for the purposes addressed by the function associated with the controlling task. The timesharing program 2220 may include an operating system, a main loop that transfers control on a round-robin basis, a function that allocates control of the one or more processors 2204 in accordance with a prioritization of the functions, and/or an interrupt driven main loop that responds to external events by providing control of the one or more processors 2204 to a handling function.

FIGS. 23 and 24 are flowcharts 2300 and 2400 illustrating methods that may be used cooperatively to receive and correct transmission errors at a receiver in a multi-wire interface.

In the first flowchart 2300 (see FIG. 23), at block 2302 the receiver may receive a sequence of symbols representative of the signaling state of a plurality of connectors.

At block 2304, the receiver may decode the sequence of symbols. An example of symbol decoding is illustrated by the second flowchart 2400 (see FIG. 24).

At block 2304, the receiver may determine whether a symbol error is present in the sequence of symbols based on a value of an EDC in the received plurality of bits.

If no error is detected, then at block 2308 the receiver may proceed to block 2310 and skip error detection. If an error is detected, then at block 2308 the receiver may initiate error detection by continuing at block 2312.

At block 2312, the receiver may generate one or more permutations of the sequence of symbols. Each permutation may include one symbol that is different from corresponding symbols in the sequence of symbols and different from corresponding symbols in other permutations. The receiver may generate a permutation for each possible value of one symbol in the sequence of symbols. In one example, the receiver may generate a permutation for each possible change in value of one symbol in the sequence of symbols. In another example, the receiver may generate a permutation corresponding to each symbol in the sequence of symbols, where a symbol is modified by a same value in each permutation.

At block 2314, the receiver may decode the one or more permutations. An example of symbol decoding is illustrated by the second flowchart 2400 (see FIG. 24). The receiver may refrain from decoding a permutation that includes two consecutive symbols having the same value.

At block 2316, the receiver may identify a permutation that produces a decoded EDC value that matches an expected EDC value. The expected EDC value may correspond to a predefined value for EDCs transmitted over the multi-wire interface to enable detection of up to two symbol errors at the receiver. The signaling error may cause a decoded version of the EDC to have a value that is different from the predefined value.

In a first example, after determining that a symbol error is present in the sequence of symbols, the receiver may concurrently generate a set of permutations of the sequence of symbols in which all members of the set of permutations include modified versions of one symbol in the sequence of symbols. That is, one target symbol in the sequence of symbols may be tested using a set of permutations in which only the target symbol is modified from permutation to permutation. The receiver may decode all members of the set of permutations concurrently. If a correct EDC is not decoded, then a next target symbol is selected and a set of permutations generated to include different values of the next symbol. This process is repeated until all symbols in the sequence of symbols have been tested.

In a second example, after determining that a symbol error is present in the sequence of symbols, the receiver may concurrently generate and decode all possible permutations of the sequence of symbols, where each permutation includes only one symbol that is modified with respect to the original sequence of symbols, and each permutation is different from all other permutations. The receiver may concurrently compare an EDC value decoded from each possible permutation of the sequence of symbols with the expected EDC value. In this example, a maximum number of decoders may be required. In this example, error correction can be performed with minimized delay.

In a third example, after determining that a symbol error is present in the sequence of symbols, the receiver may generate a set of permutations of the sequence of symbols in which the members of the set of permutations include modified versions of different symbols in the sequence of symbols. That is, each permutation in a first set of permutations, for example, includes one symbol that is modified by a fixed value x (using modulo(r) addition), each permutation in a second set of permutations includes one symbol that is modified by a fixed value x+1, and so on. Each set permutations may be tested before the next set of permutations is generated. The receiver may decode all members of the set of permutations concurrently.

In some instances, the predefined value for EDCs transmitted over the multi-wire interface has a fixed length that is determined based on a total number of states per symbol defined for encoding data transmissions on the plurality of connectors. The EDC may be provided as a predefined number of least significant bits in the plurality of bits. The predefined value for EDCs transmitted over the multi-wire interface may be determined based on a total number of symbols used to encode the plurality of bits.

A clock may be embedded in transitions between symbols in the sequence of symbols.

The plurality of connectors may have a number (N) of single-ended connectors. In one example, the total number of states per symbol available for encoding data transmissions is $2^N-x$, where x is an integer greater than zero. In another example, the total number of states per symbol available for encoding data transmissions is $N!-x$, where x is an integer greater than zero.

The second flowchart 2400 (see FIG. 24) illustrates an example of a method for decoding symbols. At block 2404 the receiver may convert the sequence of symbols into a transition number. Each digit of the transition number may represent a transition between two consecutive symbols transmitted on the plurality of connectors.

At block 2406 the receiver may convert the transition number into a received plurality of bits.

FIG. 25 is a conceptual diagram illustrating an example of a hardware implementation for an apparatus 2500 employing a processing circuit 2502. In this example, the processing circuit 2502 may be implemented with a bus architecture, represented generally by the bus 2516. The bus 2516 may include any number of interconnecting buses and bridges depending on the specific application of the processing circuit 2502 and the overall design constraints. The bus 2516 links together various circuits including one or more processors, represented generally by the processor 2512, and computer-readable media, represented generally by the processor-readable storage medium 2514. The bus 2516 may also link various other circuits such as timing sources, timers, peripherals, voltage regulators, and power management circuits. A transceiver or communications interface 2518 provides a means for communicating with various other apparatus over a multi-wire interface 2520. Depending upon the nature of the apparatus, a user interface (e.g., keypad, display, speaker, microphone, joystick) may also be provided. One or more clock generation circuits may be provided within the processing circuit 2502 or controlled by the processing circuit 2502 and/or one or more processors 2512. In one example, the clock generation circuits may include one or more crystal oscillators, one or more phase-locked loop devices, and/or one or more configurable clock trees.

The processor 2512 is responsible for managing the bus 2516 and general processing, including the execution of software stored on the processor-readable storage medium 2514. The software may include code and/or instructions that, when executed by the processor 2512, cause the processing circuit 2502 to perform the various functions described supra for any particular apparatus. The processor-readable storage medium 2514 may be used for storing data that is manipulated by the processor 2512 when executing software.

In one configuration, the processing circuit may include one or more modules and/or circuits 2504 configured for receiving a sequence of symbols representative of the signaling state of a plurality of connectors of the multi-wire interface 2520, and one or more decoding modules and/or circuits 2506 configured for decoding the sequence of symbols. For example, the decoding modules and/or circuits 2506 may be configured to convert the sequence of symbols into a transition number, where each digit of the transition number represents a transition between two consecutive symbols transmitted on the plurality of connectors, and to convert the transition number into a received plurality of bits. The processing circuit may include one or more modules and/or circuits 2504 configured for The processing circuit may include one or more error detection modules and/or circuits 2508 configured for determining whether a symbol error is present in the sequence of symbols based on a value of an EDC in the received plurality of bits. The processing circuit may include one or more error correction modules and/or circuits 2510 configured for correcting symbol errors. In one example, the error correction modules and/or circuits 2510 may be enabled when the symbol error is determined to be present in the sequence of symbols. The error correction modules and/or circuits 2510 may be configured to generate one or more permutations of the sequence of symbols, where each permutation including one symbol that is different from corresponding symbols in the sequence of symbols and different from corresponding symbols in other permutations, decode the one or more permutations, and identify a permutation that produces a decoded EDC value that matches an expected EDC value. The expected EDC value may correspond to a predefined value for EDCs transmitted over the multi-wire interface to enable detection of up to two symbol errors at the receiver.

Those of skill in the art would appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A method of correcting transmission errors at a receiver in a multi-wire interface, comprising:
   receiving a sequence of symbols representative of signaling state of a plurality of connectors;
   decoding the sequence of symbols, including:
      converting the sequence of symbols into a transition number, each digit of the transition number representing a transition between two consecutive symbols transmitted on the plurality of connectors; and
      converting the transition number into a received plurality of bits;
   determining whether a symbol error is present in the sequence of symbols based on a value of an error detection constant (EDC) in the received plurality of bits the EDC having a number of bits having a known, fixed value; and configuring an error correction circuit to:
generate one or more permutations of the sequence of symbols, each permutation including one symbol that is different from corresponding symbols in the sequence of symbols and different from corresponding symbols in other permutations;
decode the one or more permutations; and
identify a first permutation as a corrected sequence of symbols when it produces a decoded EDC value that matches an expected EDC value,
wherein the error correction circuit generates the one or more permutations, decodes the one or more permutations and identifies a permutation as the corrected sequence of symbols when the symbol error is determined to be present in the sequence of symbols,
wherein the expected EDC value corresponds to a predefined value for EDCs transmitted over the multi-wire interface to enable detection of up to two symbol errors at the receiver.

2. The method of claim 1, further comprising:
substituting the first permutation for the sequence of symbols or substituting corrected data decoded from the first permutation for error data decoded from the sequence of symbols.

3. The method of claim 1, further comprising:
concurrently generating a set of permutations of the sequence of symbols in which all members of the set of permutations include modified versions of a same symbol in the sequence of symbols when the symbol error is determined to be present in the sequence of symbols; and
concurrently decoding all members of the set of permutations.

4. The method of claim 1, further comprising:
concurrently generating and decoding all possible permutations of the sequence of symbols that include a single symbol that is modified with respect to a corresponding symbol in the sequence of symbols when the symbol error is determined to be present in the sequence of symbols; and
concurrently comparing an EDC value decoded from each possible permutation of the sequence of symbols with the expected EDC value.

5. The method of claim 1, further comprising:
concurrently generating a set of permutations of the sequence of symbols in which members of the set of permutations include modified versions of different symbols in the sequence of symbols when the symbol error is determined to be present in the sequence of symbols; and
concurrently decoding all members of the set of permutations.

6. The method of claim 1, wherein the predefined value for EDCs transmitted over the multi-wire interface has a fixed length that is determined based on a total number of states per symbol defined for encoding data transmissions on the plurality of connectors.

7. The method of claim 6, wherein the EDC is a predefined number of least significant bits in the plurality of bits, and wherein the predefined value for EDCs transmitted over the multi-wire interface is determined based on a total number of symbols used to encode the plurality of bits.

8. The method of claim 1, wherein the symbol error causes a decoded version of the EDC to have a value that is different from the predefined value.

9. The method of claim 1, wherein the plurality of connectors comprises a number (N) of single-ended connectors, and a total number of states per symbol available for encoding data transmissions is $2^N-x$, wherein x is at least 1.

10. The method of claim 1, wherein the plurality of connectors comprises a number (N) of single-ended connectors, and a total number of states per symbol available for encoding data transmissions is N!-x, wherein x is at least 1, and wherein the one or more permutations of the sequence of symbols includes r permutations per symbol where r represents a number of possible transitions per symbol.

11. The method of claim 1, wherein the plurality of connectors comprises a number (N) of single-ended connectors, and a total number of states per symbol available for encoding data transmissions is N!-x, wherein x is at least 1, and wherein the one or more permutations of the sequence of symbols includes r−1 permutations per symbol where r represents a number of possible transitions per symbol.

12. The method of claim 1, wherein decoding the one or more permutations comprises:
refraining from decoding a permutation that includes two consecutive symbols having a same value.

13. An apparatus comprising:
means for receiving a sequence of symbols representative of signaling state of a plurality of connectors;
means for decoding the sequence of symbols and configured to:
convert the sequence of symbols into a transition number, each digit of the transition number representing a transition between two consecutive symbols transmitted on the plurality of connectors; and
convert the transition number into a received plurality of bits;
means for determining whether a symbol error is present in the sequence of symbols based on a value of an error detection constant (EDC) in the received plurality of bits the EDC having a number of bits having a known, fixed value; and
means for correcting symbol errors wherein, the means for correcting symbol errors is configured to:
generate one or more permutations of the sequence of symbols, each permutation including one symbol that is different from corresponding symbols in the sequence of symbols and different from corresponding symbols in other permutations;
decode the one or more permutations; and
identify a permutation as a corrected sequence of symbols when it produces a decoded EDC value that matches an expected EDC value,
wherein the means for correcting symbol errors generates the one or more permutations, decodes the one or more permutations and identifies a permutation as the corrected sequence of symbols when the symbol error is determined to be present in the sequence of symbols,
wherein the expected EDC value corresponds to a predefined value for EDCs transmitted over the plurality of connectors to enable detection of up to two symbol errors at the receiver.

14. The apparatus of claim 13, wherein the means for correcting the symbol error is configured to:
concurrently generate a set of permutations of the sequence of symbols in which all members of the set of permutations include modified versions of a same symbol in the sequence of symbols when the symbol error is determined to be present in the sequence of symbols; and concurrently decode all members of the set of permutations.

15. The apparatus of claim 13, wherein the means for correcting the symbol error is configured to:

concurrently generate and decode all possible permutations of the sequence of symbols that include a single symbol that is modified with respect to a corresponding symbol in the sequence of symbols when the symbol error is determined to be present in the sequence of symbols; and concurrently compare an EDC value decoded from each possible permutation of the sequence of symbols with the expected EDC value.

16. The apparatus of claim 13, wherein the means for correcting the symbol error is configured to:

concurrently generate a set of permutations of the sequence of symbols in which members of the set of permutations include modified versions of different symbols in the sequence of symbols when the symbol error is determined to be present in the sequence of symbols; and concurrently decode all members of the set of permutations.

17. An apparatus comprising:

a communications transceiver configured to provide a sequence of symbols representative of signaling state of a plurality of connectors;

a decoder circuit configured to convert a transition number representative of transitions between consecutive symbols in the sequence of symbols into a plurality of bits;

an error detection circuit configured to determine whether symbol errors are present in the sequence of symbols based on a value of an error detection constant (EDC) in the received plurality of bits the EDC having a number of bits having a known, fixed value; and an error correction circuit responsive to a determination that a symbol error is present in the sequence of symbols and configured to:

generate one or more permutations of the sequence of symbols, each permutation including one symbol that is different from corresponding symbols in the sequence of symbols and different from corresponding symbols in other permutations;

decode the one or more permutations; and identify a first permutation as a corrected sequence of symbols when it produces a decoded EDC value that matches an expected EDC value, wherein the expected EDC value corresponds to a predefined value for EDCs transmitted over the plurality of connectors to enable detection of up to two symbol errors, and wherein the symbol error causes a decoded version of the EDC to have a value that is different from the predefined value.

18. The apparatus of claim 17, wherein the error correction circuit is configured to:

substitute the first permutation for the sequence of symbols or substitute corrected data decoded from the first permutation for error data decoded from the sequence of symbols; and generate a permutation for each possible value of one symbol in the sequence of symbols.

19. The apparatus of claim 17, wherein the error correction circuit is configured to:

concurrently generate a set of permutations of the sequence of symbols in which all members of the set of permutations include modified versions of a same symbol in the sequence of symbols when the symbol error is determined to be present in the sequence of symbols; and concurrently decode all members of the set of permutations.

20. The apparatus of claim 17, wherein the error correction circuit is configured to:

concurrently generate and decode all possible permutations of the sequence of symbols that include a single symbol that is modified with respect to a corresponding symbol in the sequence of symbols when the symbol error is determined to be present in the sequence of symbols; and identify the permutation that produces the decoded EDC value that matches the expected EDC value by concurrently comparing an EDC value decoded from each possible permutation of the sequence of symbols with the expected EDC value.

21. The apparatus of claim 17, wherein the error correction circuit is configured to:

concurrently generate a set of permutations of the sequence of symbols in which members of the set of permutations include modified versions of different symbols in the sequence of symbols different when the symbol error is determined to be present in the sequence of symbols; and concurrently decode all members of the set of permutations.

22. The apparatus of claim 17, wherein the predefined value for EDCs transmitted over the plurality of connectors has a fixed length that is determined based on a total number of states per symbol defined for encoding data transmissions on the plurality of connectors.

23. The apparatus of claim 17, wherein the EDC is a number of least significant bits in the plurality of bits, and wherein the predefined value for EDCs transmitted over the plurality of connectors is determined based on a total number of symbols used to encode the plurality of bits.

24. The apparatus of claim 17, wherein the error correction circuit is configured to generate one or more permutations of the sequence of symbols by:

generating a permutation for each possible change in value of one symbol in the sequence of symbols.

25. The apparatus of claim 17, wherein the error correction circuit is configured to generate one or more permutations of the sequence of symbols by:

generating a permutation corresponding to each symbol in the sequence of symbols, wherein a symbol is modified by a same value in each permutation.

26. The apparatus of claim 17, wherein the plurality of connectors comprises a number (N) of single-ended connectors, and a total number of states per symbol available for encoding data transmissions is $2^N-x$ where x is at least 1, or a total number of states per symbol available for encoding data transmissions is $N!-x$ where x is at least 1.

27. A non-transitory processor readable storage medium having code executable by the processor stored thereon, the code comprising instructions for:

receiving a sequence of symbols representative of signaling state of a plurality of connectors;

decoding the sequence of symbols, including:
  converting the sequence of symbols into a transition number, each digit of the transition number representing a transition between two consecutive symbols transmitted on the plurality of connectors; and
  converting the transition number into a received plurality of bits;
determining whether a symbol error is present in the sequence of symbols based on a value of an error detection constant (EDC) in the received plurality of bits the EDC having a number of bits having a known, fixed value;
generating one or more permutations of the sequence of symbols, each permutation including one symbol that is different from corresponding symbols in the sequence of symbols and different from corresponding symbols in other permutations;
decoding the one or more permutations; and
identifying a permutation as a corrected sequence of symbols when it produces a decoded EDC value that matches an expected EDC value,
wherein the instructions for generating the one or more permutations, decoding the one or more permutations and identifying a permutation as the corrected sequence of symbols is executed by the processor when the symbol error is determined to be present in the sequence of symbols,
wherein the expected EDC value corresponds to a predefined value for EDCs transmitted over the plurality of connectors to enable detection of up to two symbol errors.

28. The storage medium of claim 27, wherein the code includes instructions for:
  concurrently generating a set of permutations of the sequence of symbols in which all members of the set of permutations include modified versions of a same symbol in the sequence of symbols when the symbol error is determined to be present in the sequence of symbols; and
  concurrently decoding all members of the set of permutations.

29. The storage medium of claim 27, wherein the code includes instructions for:
  concurrently generating and decoding all possible permutations of the sequence of symbols that include a single symbol that is modified with respect to a corresponding symbol in the sequence of symbols when the symbol error is determined to be present in the sequence of symbols; and
  concurrently comparing an EDC value decoded from each possible permutation of the sequence of symbols with the expected EDC value.

30. The storage medium of claim 27, wherein the code includes instructions for:
  concurrently generating a set of permutations of the sequence of symbols in which members of the set of permutations include modified versions of different symbols in the sequence of symbols different when the symbol error is determined to be present in the sequence of symbols; and
  concurrently decoding all members of the set of permutations.

* * * * *